United States Patent
Yamazaki

(10) Patent No.: US 8,765,522 B2
(45) Date of Patent: *Jul. 1, 2014

(54) STACKED OXIDE MATERIAL, SEMICONDUCTOR DEVICE, AND METHOD FOR MANUFACTURING THE SEMICONDUCTOR DEVICE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 452 days.

This patent is subject to a terminal disclaimer.

(21) Appl. No.: 12/951,225

(22) Filed: Nov. 22, 2010

(65) Prior Publication Data

US 2011/0127579 A1 Jun. 2, 2011

(30) Foreign Application Priority Data

Nov. 28, 2009 (JP) ................... 2009-270855

(51) Int. Cl.
- *H01L 21/16* (2006.01)
- *H01L 29/12* (2006.01)
- *H01L 29/786* (2006.01)
- *H01L 21/02* (2006.01)
- *H01L 29/66* (2006.01)

(52) U.S. Cl.
CPC ...... *H01L 29/7869* (2013.01); *H01L 21/02472* (2013.01); *H01L 21/02483* (2013.01); *H01L 21/02554* (2013.01); *H01L 21/02565* (2013.01); *H01L 29/66765* (2013.01); *H01L 21/16* (2013.01)
USPC ............. 438/104; 438/151; 438/159; 257/43; 257/59; 257/72; 257/E51.005; 257/E29.273; 257/E21.411

(58) Field of Classification Search
CPC .................. H01L 29/7869; H01L 29/66675; H01L 21/02472; H01L 21/02483; H01L 21/02554; H01L 21/02565; H01L 21/16
USPC ......... 438/104, 149, 151, 156, 158, 159, 268, 438/283; 257/43, 52, 57, 59, 66, 72, 192
See application file for complete search history.

(56) References Cited

U.S. PATENT DOCUMENTS

| | | |
|---|---|---|
| 5,225,398 A | 7/1993 | Nakanishi et al. |
| 5,731,856 A | 3/1998 | Kim et al. |

(Continued)

FOREIGN PATENT DOCUMENTS

| | | | |
|---|---|---|---|
| EP | 1443130 A | 8/2004 | |
| EP | 1557889 A | 7/2005 | |

(Continued)

OTHER PUBLICATIONS

International Search Report (Application No. PCT/JP2010/069778) Dated Jan. 18, 2011.

(Continued)

*Primary Examiner* — Alonzo Chambliss
(74) *Attorney, Agent, or Firm* — Eric J. Robinson; Robinson Intellectual Property Law Office, P.C.

(57) ABSTRACT

One embodiment is a method for manufacturing a stacked oxide material, including the steps of forming a first oxide component over a base component, causing crystal growth which proceeds from a surface toward an inside of the first oxide component by first heat treatment to form a first oxide crystal component at least partly in contact with the base component, forming a second oxide component over the first oxide crystal component; and causing crystal growth by second heat treatment using the first oxide crystal component as a seed to form a second oxide crystal component.

63 Claims, 14 Drawing Sheets

(56) References Cited

U.S. PATENT DOCUMENTS

| | | | |
|---|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,838,308 B2 | 1/2005 | Haga |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,157,307 B2 | 1/2007 | Ishizaki |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,847,287 B2 | 12/2010 | Kim et al. |
| 7,910,490 B2 | 3/2011 | Akimoto et al. |
| 7,935,964 B2 | 5/2011 | Kim et al. |
| 7,994,500 B2 | 8/2011 | Kim et al. |
| 8,038,857 B2 | 10/2011 | Inoue et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,222,092 B2 | 7/2012 | Yamazaki et al. |
| 8,236,627 B2 * | 8/2012 | Tsubuku et al. ............ 438/149 |
| 8,247,276 B2 * | 8/2012 | Kondo et al. ................ 438/151 |
| 8,247,813 B2 * | 8/2012 | Koyama et al. ............... 257/43 |
| 8,274,078 B2 | 9/2012 | Itagaki et al. |
| 8,362,563 B2 * | 1/2013 | Kondo et al. ................ 257/352 |
| 8,367,489 B2 * | 2/2013 | Yamazaki ................... 438/156 |
| 2001/0046027 A1 | 11/2001 | Tai et al. |
| 2002/0042170 A1 * | 4/2002 | Yamazaki et al. ........... 438/151 |
| 2002/0056838 A1 | 5/2002 | Ogawa |
| 2002/0132454 A1 | 9/2002 | Ohtsu et al. |
| 2002/0164888 A1 | 11/2002 | Roh et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017261 A1 | 1/2005 | Ishizaki |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287221 A1 | 12/2007 | Ong et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0206332 A1 | 8/2009 | Son et al. |
| 2009/0224238 A1 | 9/2009 | Kim et al. |
| 2009/0242992 A1 | 10/2009 | Kim et al. |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2009/0305461 A1 | 12/2009 | Akimoto et al. |
| 2010/0051935 A1 | 3/2010 | Lee et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0109003 A1 | 5/2010 | Akimoto et al. |
| 2010/0136743 A1 | 6/2010 | Akimoto et al. |
| 2010/0176383 A1 | 7/2010 | Park et al. |
| 2010/0244022 A1 | 9/2010 | Takahashi et al. |
| 2010/0276689 A1 | 11/2010 | Iwasaki |
| 2010/0279462 A1 | 11/2010 | Iwasaki |
| 2010/0283055 A1 | 11/2010 | Inoue et al. |
| 2010/0283509 A1 | 11/2010 | Kim et al. |
| 2010/0320458 A1 | 12/2010 | Umeda et al. |
| 2010/0320459 A1 | 12/2010 | Umeda et al. |
| 2011/0049509 A1 | 3/2011 | Takahashi et al. |
| 2011/0062436 A1 | 3/2011 | Yamazaki et al. |
| 2011/0073856 A1 | 3/2011 | Sato et al. |
| 2011/0115839 A1 | 5/2011 | Takahashi et al. |
| 2011/0127521 A1 | 6/2011 | Yamazaki |
| 2011/0127522 A1 | 6/2011 | Yamazaki |
| 2011/0127523 A1 | 6/2011 | Yamazaki |
| 2011/0133191 A1 * | 6/2011 | Yamazaki ...................... 257/57 |
| 2011/0193083 A1 | 8/2011 | Kim et al. |
| 2011/0215328 A1 | 9/2011 | Morosawa et al. |
| 2011/0284848 A1 * | 11/2011 | Yamazaki ...................... 257/57 |
| 2012/0032163 A1 | 2/2012 | Yamazaki |

(56) References Cited

U.S. PATENT DOCUMENTS

| | | | |
|---|---|---|---|
| 2012/0052624 A1* | 3/2012 | Yamazaki | 438/104 |
| 2012/0064665 A1* | 3/2012 | Yamazaki | 438/104 |
| 2012/0119205 A1 | 5/2012 | Taniguchi et al. | |
| 2012/0205651 A1 | 8/2012 | Lee et al. | |
| 2013/0082256 A1 | 4/2013 | Yamazaki | |

FOREIGN PATENT DOCUMENTS

| | | |
|---|---|---|
| EP | 1737044 A | 12/2006 |
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2120267 A | 11/2009 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-026119 A | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-041362 A | 2/2003 |
| JP | 2003-086000 A | 3/2003 |
| JP | 2003-086808 A | 3/2003 |
| JP | 2003-137692 A | 5/2003 |
| JP | 2003-298062 A | 10/2003 |
| JP | 2004-103957 A | 4/2004 |
| JP | 2004-153062 A | 5/2004 |
| JP | 2004-273614 A | 9/2004 |
| JP | 2004-273732 A | 9/2004 |
| JP | 2005-033172 A | 2/2005 |
| JP | 2006-165529 A | 6/2006 |
| JP | 2006-313776 A | 11/2006 |
| JP | 2007-096055 A | 4/2007 |
| JP | 2007-103918 A | 4/2007 |
| JP | 2007-123861 A | 5/2007 |
| JP | 2008-098447 A | 4/2008 |
| JP | 2009-021612 A | 1/2009 |
| JP | 2009-075385 A | 4/2009 |
| JP | 2009-094535 A | 4/2009 |
| JP | 2009-218562 A | 9/2009 |
| JP | 2009-231613 A | 10/2009 |
| JP | 2009-246362 A | 10/2009 |
| JP | 2009-278115 A | 11/2009 |
| JP | 2010-016347 A | 1/2010 |
| JP | 2010-040552 A | 2/2010 |
| JP | 4415062 | 2/2010 |
| JP | 2010-067954 A | 3/2010 |
| JP | 2010-177431 A | 8/2010 |
| JP | 4571221 | 10/2010 |
| JP | 2012-160679 A | 8/2012 |
| WO | WO-2004/114391 | 12/2004 |
| WO | WO-2005/088726 | 9/2005 |
| WO | WO-2007/029844 | 3/2007 |
| WO | WO-2008/133345 | 11/2008 |
| WO | WO 2009/034953 | 3/2009 |
| WO | WO-2009/034953 | 3/2009 |

OTHER PUBLICATIONS

Written Opinion (Application No. PCT/JP2010/069778) Dated Jan. 18, 2011.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$-$Ga_2ZnO_4$-ZnO system at 1350°C,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m = 3, 4, and 5), $InGaO_3(ZnO)_3$, and $Ga_2O_3(ZnO)_m$ (m = 7, 8, 9, and 16) in the $In_2O_3$-$ZnGa_2O_4$-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$-$In_2O_3$-ZnO) TFT,", SID Digest '08 : SID International Symposium Digest of Technical Papers, May 20, 2008, vol. 39, pp. 633-636.

Lee.J et al., "World's Largest (15-inch) XGA AMLCD Panel using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

(56) References Cited

OTHER PUBLICATIONS

Tsuda.K et al., "Ultra Low Power Consumption Technologies for Mobile TFT-LCDs,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:AL and SN-Doped Zinc Indium Oxide Thin Film Transistors for AMOLED Back-plane,", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering,", SD Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on plastic film and its Bending Properties,", SID Digest '09 : SID International Symposium Digest of Technical Papers, May 31, 2009, pp. 983-985.
Sakata.J et al., "Development of 4.0-IN. AMOLED Display with Driver Circuit Using Amorphous In-Ga-Zn-Oxide TFTS,", IDW '09 : Proceedings of the 16th International Display Workshops, 2009, pp. 689-692.
Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.
Osada.T et al., "Development of Driver-Integrated Panel Using Amorphous In-Ga-Zn-Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTS) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 IN. QVGA AMOLED Display Using In-Ga-Zn-Oxide TFTS With a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest Technical Papers, May 31, 2009, pp. 395-398.
Lee.H et al., "Current Status of, Challenges to, and Perspective View of AM-OLED,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 1, 2002, vol. 1, pp. 64-68.
Kimizuka.N et al., "Spinel,$YBFE_2O_4$, and $YB_2FE_3O_7$ Types of Structures for Compounds in the $In_2O_3$ and $SC_2O_3$-$A_2O_3$-BO Systems [A; Fe, Ga, or Al;B; Mg, Mn, Fe, Ni, Cu, or Zn] at Temperatures over 1000° C,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent $InGaZnO_4$,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide $InGaO_3(ZnO)m$ (m<4):a Zn4s conductor,", Philosophical Magazine, 2001, vol. 81, No. 5, pp. 501-515.

(56) References Cited

OTHER PUBLICATIONS

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Nakamura et al., "Syntheses and crystal structures of new homologous compounds, indium iron zinc oxides (InFeO3(ZnO)m) (m natural number) and related compounds,", Kotai Butsuri (Solid State Physics), 1993, vol. 28, No. 5, pp. 317-327.

Nakayama et al., "17a-TL-8 Effect of GaO Layer on IGZO-TFT Channel,", Extended Abstracts (The 57th Spring Meeting 2010), The Japan Society of Applied Physics and Related Societies, Mar. 17, 2010, pp. 21-008.

Nomura.K et al., "Growth mechanism for single-crystalline thin film of InGaO3(ZnO)5 by reactive solid-phase epitaxy,", J. Appl. Phys. (Journal of Applied Physics), May 15, 2004, vol. 95, No. 10, pp. 5532-5539.

Ogo.Y et al., "Growth and structure of heteroepitaxial thin films of homologous compounds RAO3(MO)m by reactive solid-phase epitaxy: Applicability to a variety of materials and epitaxial template layers,", Thin Solid Films, Oct. 19, 2005, vol. 496, pp. 64-69.

\* cited by examiner

FIG. 4A
FIG. 4B
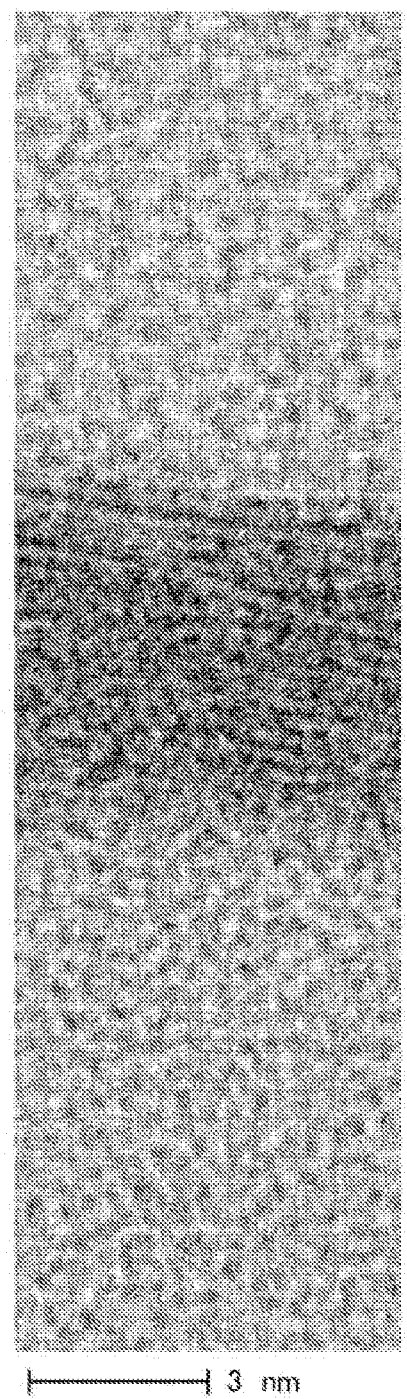
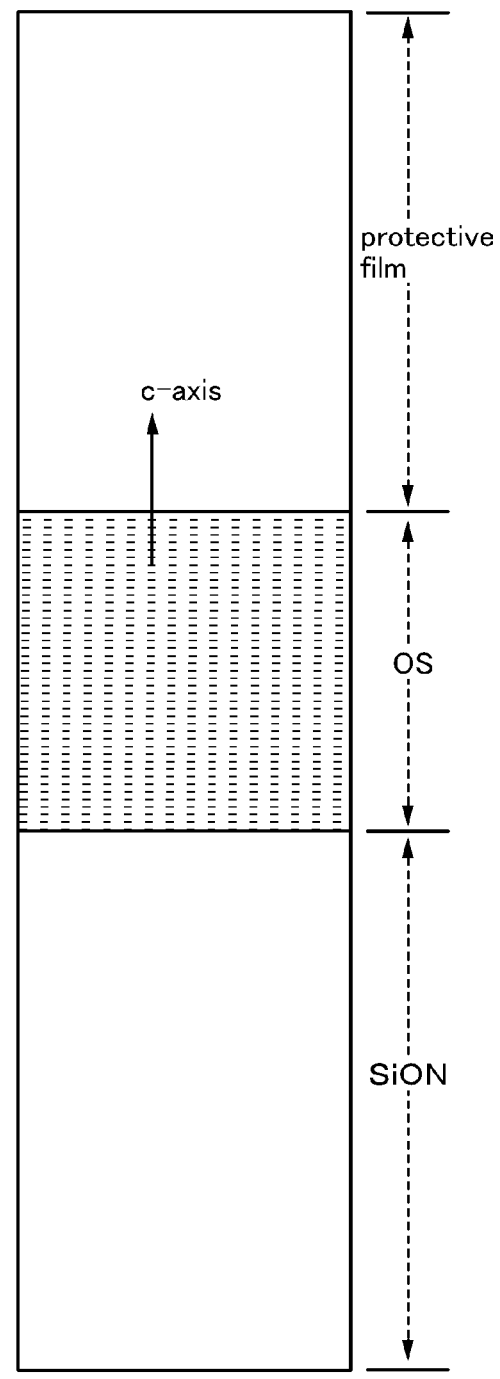

FIG. 5A
FIG. 5B
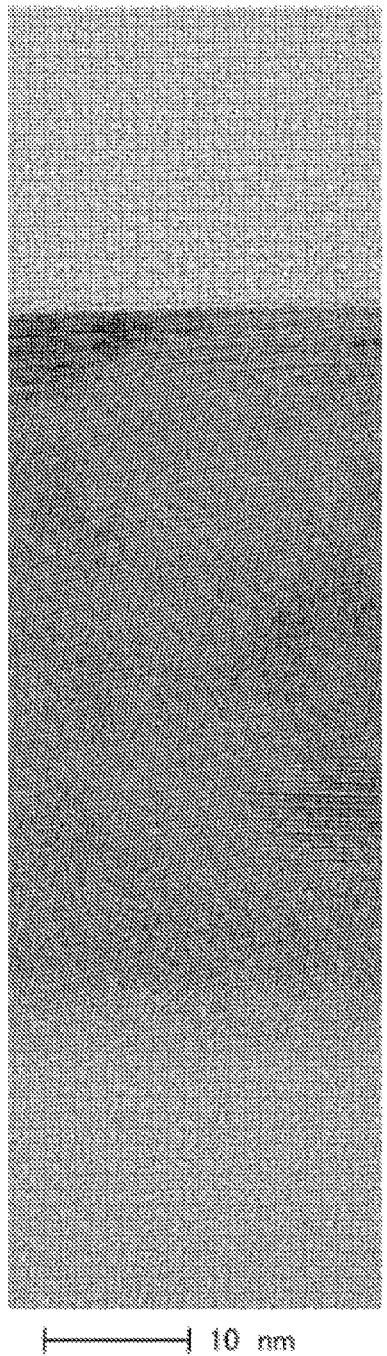
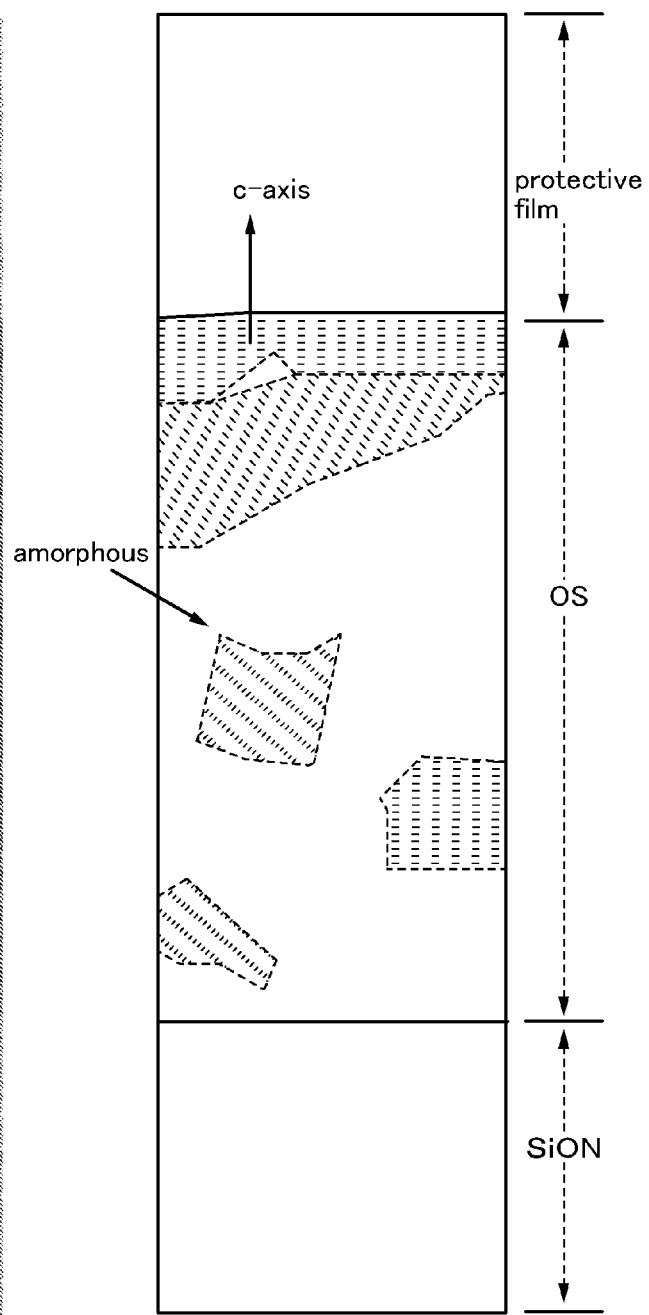

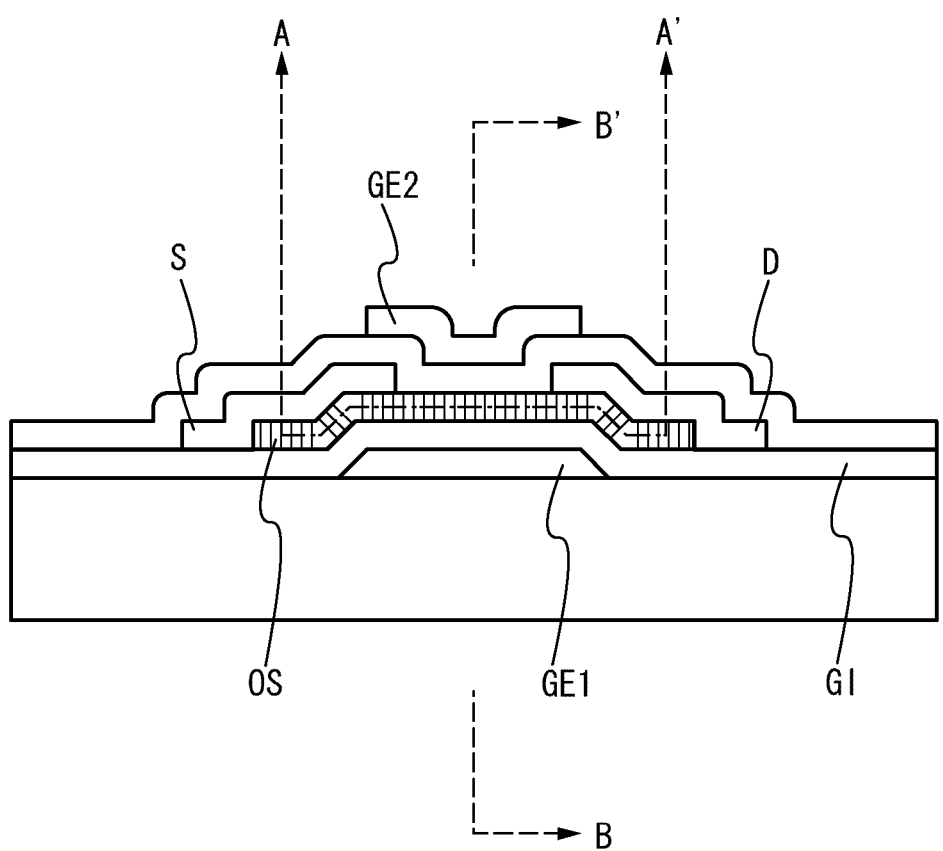

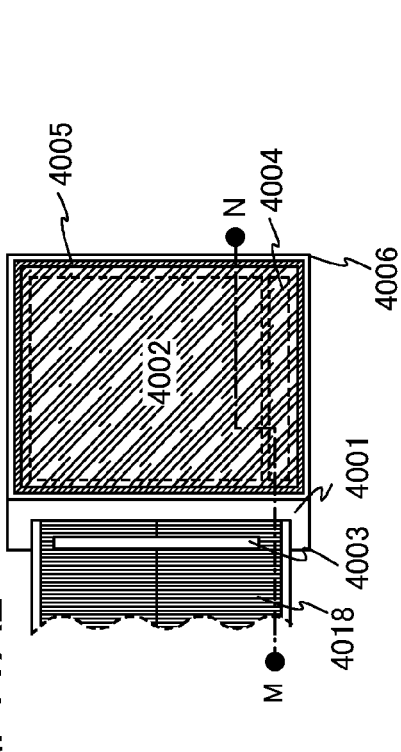
FIG. 11A1
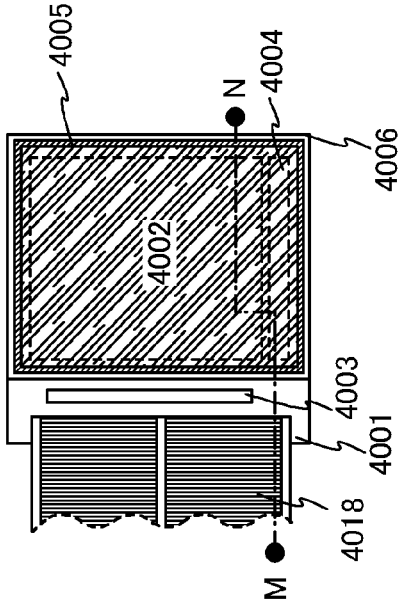
FIG. 11A2
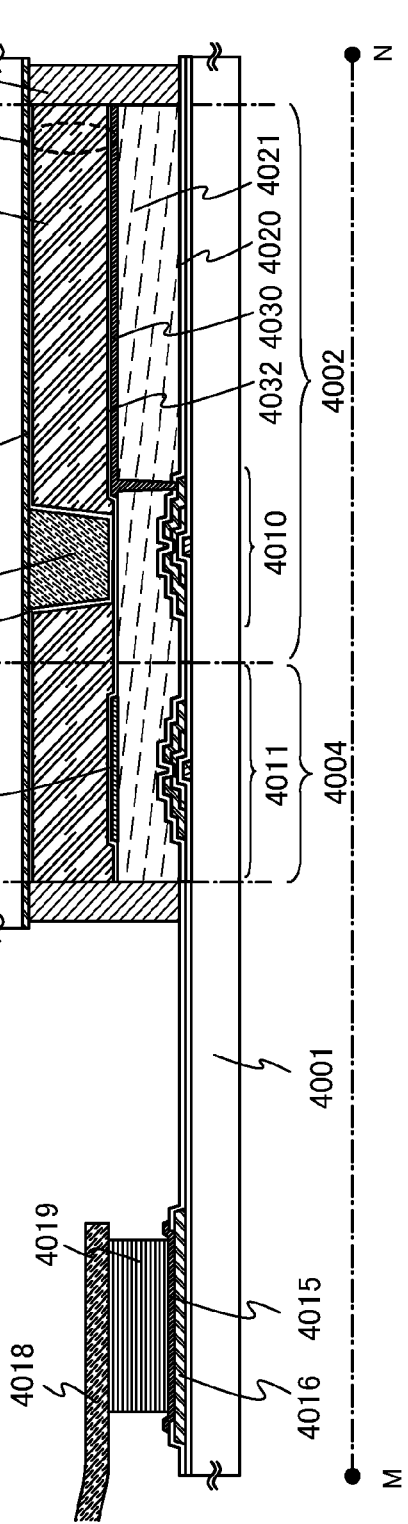
FIG. 11B

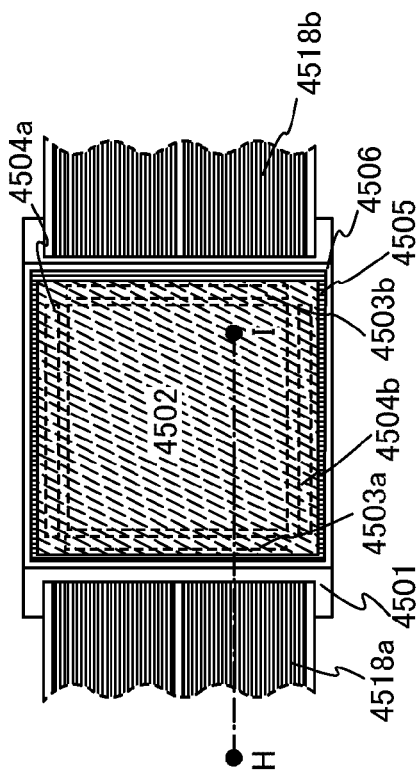
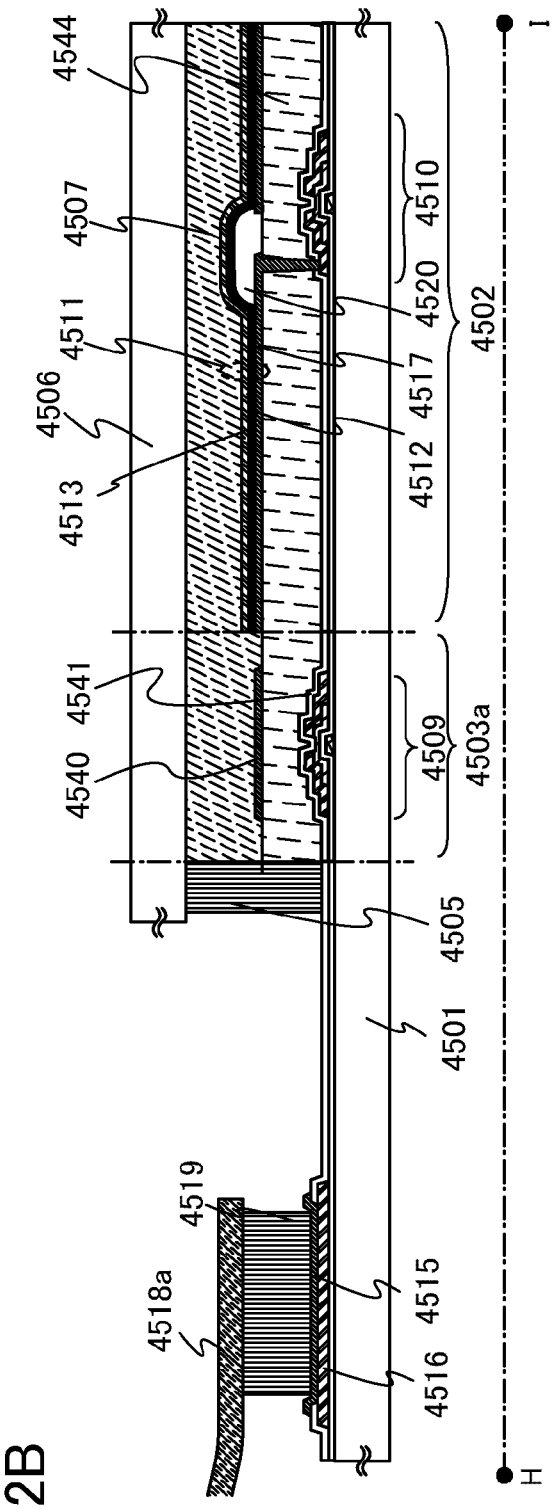
FIG. 12A
FIG. 12B

STACKED OXIDE MATERIAL, SEMICONDUCTOR DEVICE, AND METHOD FOR MANUFACTURING THE SEMICONDUCTOR DEVICE

TECHNICAL FIELD

The present invention relates to a stacked oxide material which is formed by stacking films by a sputtering method and the films are subjected to crystallization heat treatment, and which is used for manufacturing a semiconductor device. For example, a material which is suitably used for a semiconductor included in a transistor, a diode, or the like is provided. In addition, the present invention relates to a semiconductor device including a circuit formed with semiconductor elements such as a transistor, and a manufacturing method thereof. For example, the present invention relates to a power device which is mounted on a power supply circuit; a semiconductor integrated circuit including a memory, a thyristor, a converter, image sensor, or the like; and an electronic appliance on which an electro-optical device typified by a liquid crystal display panel or a light-emitting display device including an organic light-emitting element is mounted as a component.

In this specification, a semiconductor device generally means a device which can function by utilizing semiconductor characteristics, and an electro-optical device, a semiconductor circuit, and electronic appliance are all semiconductor devices.

BACKGROUND ART

Although Si is a typical semiconductor material, SiC, GaN, and the like also have been researched as a semiconductor material in addition to Si. However, SiC, GaN, and the like need to be subjected to treatment at a temperature higher than or equal to 1500° C. so as to be crystallized and used as a single crystal component; therefore, these semiconductor materials cannot be used for thin film devices or three-dimensional devices.

On the other hand, in recent years, techniques to form transistors using a semiconductor thin film (with a thickness of approximately several nanometers to several hundreds of nanometers) which is formed over a substrate having an insulating surface at a relatively low temperature have attracted attention. The transistors are widely applied to electronic devices such as an IC and an electro-optical device, and development thereof as switching elements for an image display device has been particularly expected.

There are various kinds of metal oxides, which are used for a wide range of applications. Indium oxide is a well-known material and is used as a light-transmitting electrode material which is necessary for liquid crystal displays and the like. Some metal oxides have semiconductor characteristics. Examples of the metal oxides having semiconductor characteristics are tungsten oxide, tin oxide, indium oxide, zinc oxide, and the like. Transistors in which a channel formation region is formed using such a metal oxide having semiconductor characteristics are already known (Patent Document 1 and Patent Document 2).

REFERENCE

Patent Document

[Patent Document 1] Japanese Published Patent Application No. 2007-123861

[Patent Document 2] Japanese Published Patent Application No. 2007-096055

DISCLOSURE OF INVENTION

One object of an embodiment of the present invention is to provide a material suitably used for a semiconductor included in a transistor, a diode, or the like, with the use of a sputtering method.

One object of an embodiment of the present invention is to provide a transistor having high field-effect mobility and low off current. In addition, one object of an embodiment of the present invention is to obtain a so-called normally-off switching element and provide a semiconductor device with low power consumption. Further, one object of an embodiment of the present invention is to provide a transistor having high transistor performance and high reliability.

In addition, one object of an embodiment of the present invention is to provide a productive manufacturing process through which a semiconductor device including semiconductor elements such as a transistor can be obtained at low cost.

Further, one object of an embodiment of the present invention is to provide a transistor having high reliability.

One embodiment of the present invention disclosed in this specification is a method for manufacturing a stacked oxide material, including the steps of forming an oxide component over a base component, causing crystal growth which proceeds from a surface toward an inside of the oxide component by heat treatment to form a first oxide crystal component at least partly in contact with the base component, and stacking a second oxide crystal component over the first oxide crystal component. In particular, the first oxide crystal component and the second oxide crystal component have common c-axes. Note that a surface of the first oxide crystal component has an a-b plane, and the first oxide crystal component is c-axis-aligned perpendicularly to the surface of the first oxide crystal component. Note that on the a-b plane, a plurality of elements adjacent to each other is the same. In addition, the c-axis direction of the first oxide crystal component corresponds to the depth direction.

In the above manufacturing method, at least part or the whole of a bottom surface of the first oxide crystal component in which crystals are aligned is provided to be in contact with the base component. By appropriately adjusting the thickness of the oxide component, heating conditions, or the like, the bottom surface of the first oxide crystal component in which crystals are aligned is provided so that at least part or the whole of the bottom surface is in contact with the base component.

In the above manufacturing method, annealing is performed after deposition of the oxide component and a second oxide semiconductor layer is deposited over a top surface of the first oxide crystal component. After that, a crystal is grown from the surface of the first oxide crystal component toward a surface of the second oxide semiconductor layer which is an upper layer. The first oxide crystal component corresponds to a seed crystal of the second oxide semiconductor layer. It is important to form a second single crystal layer above the first oxide crystal component.

When the whole oxide semiconductor layer becomes single crystal layer, and as the crystallinity of the oxide semiconductor layer is increased, the amount of change in the threshold voltage of a transistor before and after a BT test can be suppressed, so that high reliability can be obtained.

In addition, as the crystallinity of the oxide semiconductor layers is increased, temperature dependence of electric characteristics of the transistor, for example, the amount of change in on current or off current at temperatures of from −30° C. to 120° C. can be suppressed. Although the operation temperature range of a general display panel is higher than or equal to 0° C. and lower than or equal to 40° C., for example, an in-car display panel needs heat resistance against a temperature higher than or equal to −30° C. and lower than or equal to 85° C., or further up to 105° C. Without limitation to a display panel, when an oxide semiconductor layer having high crystallinity for a switching element or a driver circuit is used, a device capable of withstanding various severe surroundings can be obtained, which is advantageous for expanding usage or application fields.

In addition, when the whole oxide semiconductor layer becomes single crystal layer and the crystallinity of the semiconductor layer is increased, a transistor having high field-effect mobility can be obtained.

Another embodiment of the present invention is a method for manufacturing a stacked oxide material, including the steps of forming an oxide component over a base component, causing crystal growth which proceeds from a surface toward an inside of the oxide component by the heat treatment to form a first oxide crystal component which is at least partly in contact with the base component and c-axis-aligned perpendicularly to the surface, and stacking a second oxide crystal component whose c-axis is aligned with the c-axis of the first oxide crystal component, over the first oxide crystal component.

Another embodiment of the present invention is a method for manufacturing a stacked oxide material, including the steps of forming an oxide component over a base component, causing crystal growth which proceeds from a surface toward an inside of the oxide component by the heat treatment to form a first oxide crystal component at least partly in contact with the base component, and stacking a second oxide crystal component over the first oxide crystal component. In this embodiment, each of the first oxide crystal component and the second oxide crystal component is a crystal which is c-axis-aligned perpendicularly to the surface.

Another embodiment of the present invention is a method for manufacturing a stacked oxide material, including the steps of forming a first oxide component over a base component, causing crystal growth which proceeds from a surface toward an inside of the first oxide component by first heat treatment to form a first oxide crystal component at least partly in contact with the base component, forming a second oxide component over the first oxide crystal component; and causing crystal growth by second heat treatment using the first oxide crystal component as a seed to form a second oxide crystal component.

In each of the above structures, the oxide crystal component whose c-axis alignment is in contact with the base component is a polycrystalline component.

In each of the above structures, a crystal growth component whose base component has a recessed portion or a projection portion includes a grain boundary at an interface between the base component and the recessed portion or the projection portion.

In each of the above structures, the second oxide crystal component is obtained by causing crystal growth in a state where heating is performed at a temperature during deposition of higher than or equal to 200° C. and lower than or equal to 600° C.

In each of the above structures, the second oxide crystal component is formed by a sputtering method, heat treatment is performed after or at the same time as the deposition of the second oxide crystal component, and a metal oxide target for the deposition has a composition ratio of In:Ga:Z=1:x:y (x is greater than or equal to 0 and less than or equal to 2, and y is greater than or equal to 1 and less than or equal to 5).

In each of the above structures, the first oxide crystal component has high purity and has an intrinsic conductivity type.

In each of the above structures, the second oxide crystal component has high purity and has an intrinsic conductivity type.

One technical idea of the present invention is that an impurity is not added to an oxide semiconductor and on the contrary the oxide semiconductor itself is highly purified by intentionally removing an impurity such as water or hydrogen which undesirably exists therein. In other words, the technical idea is that an oxide semiconductor is highly purified by removing water or hydrogen which forms a donor level, reducing oxygen vacancy, and sufficiently supplying oxygen which is a main component of the oxide semiconductor.

At the time just after the oxide semiconductor is deposited, hydrogen at density of $10^{20}$ cm$^{-3}$ is measured using secondary ion mass spectrometry (SIMS). By intentionally removing water or hydrogen which forms a donor level and further by adding oxygen (one of components of the oxide semiconductor), which decreases at the same time as removing water or hydrogen, to the oxide semiconductor, the oxide semiconductor is highly purified to be an electrically i-type (intrinsic) semiconductor.

Further, in one technical idea of the present invention, it is preferable that the amount of water and hydrogen be as small as possible, and it is also preferable that the number of carriers in an oxide semiconductor be as small as possible. In other words, a carrier density of less than $1 \times 10^{12}$ cm$^{-3}$, preferably less than $1.45 \times 10^{10}$ cm$^{-3}$ which is less than or equal to the measurement limit is needed. In addition, an ideal career density is 0 or approximately 0 in the technical idea of the embodiments. In particular, when an oxide semiconductor is subjected to heat treatment in an oxygen atmosphere, a nitrogen atmosphere, or an atmosphere of ultra-dry air (air in which the water content is less than or equal to 20 ppm, preferably less than or equal to 1 ppm, more preferably less than or equal to 10 ppb) at a temperature higher than or equal to 450° C. and lower than or equal to 850° C., preferably higher than or equal to 550° C. and lower than or equal to 750° C., water or hydrogen which is to be an n-type impurity can be removed and the oxide semiconductor can be highly purified. In addition, when the oxide semiconductor is highly purified by removing an impurity such as water or hydrogen, the carrier density thereof can be less than $1 \times 10^{12}$ cm$^{-3}$, preferably less than $1.45 \times 10^{10}$ cm$^{-3}$ which is less than or equal to the measurement limit.

In addition, when the heat treatment is performed at a high temperature, that is, a temperature higher than or equal to 450° C. and lower than or equal to 850° C., preferably higher than or equal to 600° C. and lower than or equal to 700° C., the oxide semiconductor can be highly purified and also crystallized, and crystal growth proceeds from a surface of the oxide semiconductor toward the inside thereof, so that the oxide semiconductor has a single crystal region whose c-axis is aligned.

According to an embodiment of the present invention, the oxide semiconductor having a single crystal region whose c-axis is aligned is used as a seed crystal, a second oxide semiconductor is formed thereover, and heat treatment is performed at a temperature higher than or equal to 450° C. and lower than or equal to 850° C., preferably higher than or equal to 550° C. and lower than or equal to 750° C., so that the second oxide semiconductor can have a single crystal region whose c-axis is aligned in a similar manner to the seed crystal.

That is to say, ideal axial growth or epitaxial growth in which the seed crystal and the second oxide semiconductor have c-axes which are aligned in the same direction can be performed.

The second oxide semiconductor having the same axis as the seed crystal can be stacked and also the crystal thereof can be grown by not only performing solid-phase growth by heat treatment after deposition but also by depositing with the use of typically sputtering in a state where heating is performed at a temperature higher than or equal to 200° C. and lower than or equal to 600° C., preferably higher than or equal to 200° C. and lower than or equal to 550° C.

In addition, carriers in the oxide semiconductor are reduced, or preferably all carriers are removed, so that the oxide semiconductor serves as a path through which carriers pass in a transistor. As a result, the oxide semiconductor is a highly purified i-type (intrinsic) semiconductor which has no carrier or very few carriers, so that off current of a transistor in an off state can be extremely low, which is the technical idea of the embodiments.

In addition, when the oxide semiconductor serves as a path, and the oxide semiconductor itself is a highly purified i-type (intrinsic) semiconductor which has no carriers or very few carriers, carriers are supplied by a source electrode and a drain electrode. When the electron affinity $\chi$ and the Fermi level, preferably the Fermi level corresponding to the intrinsic Fermi level in the oxide semiconductor and the work functions of the source and drain electrodes are appropriately selected, carriers can be injected from the source electrode and the drain electrode. Therefore, an n-channel transistor and a p-channel transistor can be manufactured appropriately.

All of the oxide crystal components and the oxide components are metal oxides, and a four-component metal oxide film such as an In—Sn—Ga—Zn—O-based film; a three-component metal oxide film such as an In—Ga—Zn—O-based film, an In—Sn—Zn—O-based film, an In—Al—Zn—O-based film, a Sn—Ga—Zn—O-based film, an Al—Ga—Zn—O-based film, or a Sn—Al—Zn—O-based film; a two-component metal oxide film such as an In—Zn—O-based film, a Sn—Zn—O-based film, an Al—Zn—O-based film, a Zn—Mg—O-based film, a Sn—Mg—O-based film, or an In—Mg—O-based film; or a single-component metal oxide film such as an In—O-based film, a Sn—O-based film, or a Zn—O-based film can be used. Note that here, for example, an In—Sn—Ga—Zn—O film means an oxide film containing indium (In), tin (Sn), gallium (Ga), and zinc (Zn), and there is no particular limitation on the stoichiometric proportion thereof.

As the oxide crystal components and the oxide components, a thin film expressed by $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like.

In addition, an oxide semiconductor material expressed by In-A-B-O may be used. Here, A represents one or plural kinds of elements selected from elements belonging to Group 13, such as gallium (Ga) or aluminum (Al), elements belonging to Group 14 typified by silicon (Si) or germanium (Ge), and the like. In addition, B represents one or plural kinds of elements selected from elements belonging to Group 12 typified by zinc (Zn). Note that the In content, the A content, and the B content are set freely, and the case where the A content is 0 is included. On the other hand, the In content and the B content are not 0. In other words, the above expression includes In—Ga—Zn—O, In—Zn—O, and the like. In addition, an oxide semiconductor material expressed by In—Ga—Zn—O in this specification is $InGaO_3(ZnO)_m$ (m>0).

A conventional oxide semiconductor is generally an n-type. In a transistor including the conventional oxide semiconductor, current flows between a source electrode and a drain electrode even when a gate voltage is 0 V; in other words, the transistor tends to be normally on. When a transistor is normally on even with high field-effect mobility, it is difficult to control the circuit. The Fermi level (Ef) of an n-type oxide semiconductor is away from the intrinsic Fermi level (Ei) located in the middle of a band gap and is located closer to the conduction band. Note that it is known that hydrogen is a donor in an oxide semiconductor and is one factor causing an oxide semiconductor to be an n-type semiconductor. In addition, it is known that a oxygen vacancy is one factor causing an oxide semiconductor to be an n-type semiconductor.

Thus, in order to obtain an i-type oxide semiconductor layer, hydrogen, which is an n-type impurity, is removed from an oxide semiconductor and the oxide semiconductor is highly purified so as to contain impurities which are not a main component of the oxide semiconductor as little as possible, and oxygen vacancy is removed. In this manner, an intrinsic (i-type) or a substantially intrinsic oxide semiconductor is obtained. In other words, a feature is that a highly-purified i-type (intrinsic) semiconductor or a semiconductor close thereto is obtained not by adding an impurity but by removing an impurity such as hydrogen or water and oxygen vacancy as much as possible. This enables the Fermi level (Ef) to be at the same level as the intrinsic Fermi level (Ei).

By highly purifying the oxide semiconductor layer, a threshold voltage of the thin film transistor can be positive, whereby a so-called normally-off switching element can be realized.

As one step for high purification, it is preferable to remove moisture and the like in a sputtering apparatus before, during, or after deposition of an oxide semiconductor film. In order to remove moisture in the sputtering apparatus, an adsorption-type vacuum pump is preferably used. For example, a cryopump, an ion pump, or a titanium sublimation pump is preferably used. The evacuation unit can be a turbo pump provided with a cold trap. In the deposition chamber of the sputtering apparatus which is evacuated with the cryopump, for example, a hydrogen atom, a compound containing a hydrogen atom, such as water ($H_2O$), and the like are removed, whereby the concentration of an impurity in the oxide semiconductor film formed in the deposition chamber can be reduced. In addition, it is preferable that an oxide semiconductor contained in a target for an oxide semiconductor has a relative density of 80% or more, preferably 95% or more, more preferably 99.9% or more. When the target having high relative density is used, an impurity concentration in an oxide semiconductor film to be formed can be reduced.

If an impurity is mixed into the oxide semiconductor film to be formed, crystal growth in one direction, that is, crystal growth which proceeds downwardly from a surface may be interrupted at the time of heat treatment for crystallization which is performed later. Therefore, the ideal state is that the oxide semiconductor film contains no impurity. Accordingly, high purification is extremely important.

In addition, before deposition of the oxide semiconductor film, pre-heat treatment may be performed in order to remove moisture or hydrogen which exists on an inner wall of a sputtering apparatus, on a target surface, or in the material of the target. As the pre-heat treatment, a method in which the inside of the deposition chamber is heated to 200° C. to 600°

C. under reduced pressure, a method in which introduction and evacuation of nitrogen or an inert gas are repeated while the inside of the deposition chamber is heated, and the like can be given. In this case, not water but oil or the like is preferably used as a coolant for the target. Although a certain level of effect can be obtained when introduction and exhaust of nitrogen are repeated without heating, it is more preferable to perform the treatment with the inside of the deposition chamber heated. After the preheat treatment, the substrate or the sputtering apparatus is cooled, and then the oxide semiconductor film is formed.

In addition, as the sputtering gas used for forming the oxide semiconductor film or a material film formed thereon, a high-purity gas is preferably used in which impurities such as hydrogen, water, a hydroxyl group, or hydride are reduced to such a level that the impurity concentration is represented by the unit "ppm" or "ppb".

The substrate may be heated to a temperature higher than or equal to 200° C. and lower than or equal to 600° C. during the deposition of the oxide semiconductor film by a sputtering method. When the deposition is performed at this substrate temperature, pre-alignment can be performed. In addition, direct epitaxial growth or axial growth can be performed.

In addition, as one step for high purification, first heat treatment is performed in an atmosphere which hardly contains hydrogen and moisture (such as a nitrogen atmosphere, an oxygen atmosphere, or a dry-air atmosphere (for example, as for the moisture, a dew point is lower than or equal to −40° C., preferably lower than or equal to −50° C.)). The first heat treatment can be called dehydration or dehydrogenation, which is for detaching H, OH, or the like from the oxide semiconductor layer. In the case where temperature is raised in an inert atmosphere, and the atmosphere is switched to an atmosphere containing oxygen during heat treatment, or in the case where an oxygen atmosphere is employed, the first heat treatment can also be called additional oxidation treatment.

For the first heat treatment, a heating method using an electric furnace, a rapid heating method such as a gas rapid thermal anneal (GRTA) method using a heated gas or a lamp rapid thermal anneal (LRTA) method using lamp light, or the like can be used. In addition, as the first heat treatment, heating with irradiation with a light having a wavelength less than or equal to 450 nm may be performed at the same time. The oxide semiconductor layer subjected to the first heat treatment for high purification is heated under conditions that at least a peak at around 300° C. of two peaks of water are/is not detected when the oxide semiconductor layer after the first heat treatment is measured with thermal desorption spectroscopy (TDS) while the temperature is increased to 450° C. Therefore, even if TDS is performed at up to 450° C. on a transistor including the oxide semiconductor layer subjected to heat treatment for high purification, at least the peak of water at around 300° C. is not detected.

Since crystal growth is performed in a state where there is no single crystal layer which serves as a seed of crystal growth, it is preferable that the first heat treatment be performed at high temperature for a short time so that only crystal growth from a surface is performed. In addition, when a surface of the oxide semiconductor layer is flat, a favorable plate-shaped single crystal layer can be obtained. Therefore, it is preferable that flatness of a base component such as an insulating layer or a substrate be as high as possible. Increase of flatness is effective because a single crystal layer in contact with an entire surface of the base component can be formed easily. For example, the flatness of the oxide semiconductor layer is approximately equivalent to that of a commercial silicon wafer; for example, difference in height of surface roughness in a region of 1 μm×1 μm by AFM measurement is less than or equal to 1 nm, preferably 0.2 nm.

In the single crystal layer, when electron clouds of In included in the oxide semiconductor overlap with each other and are connected to each other, electric conductivity σ is increased. Accordingly, a transistor including the single crystal layer can have high field-effect mobility.

One of methods for further causing crystal growth with the use of the plate-shaped single crystal layer formed by the first heat treatment as a seed is described below with reference to FIGS. 1A, 1B, and 1C.

The outline of the order of steps is as follows: the first oxide semiconductor layer is formed over the base component; first heat treatment for high purification is performed; the single crystal layer whose crystal direction is aligned is formed at a surface of the first oxide semiconductor layer in the same step as the first heat treatment for high purification; the second oxide semiconductor layer is stacked thereover; and further, second heat treatment for crystallization is performed, so that the second oxide semiconductor layer is crystallized with the use of the single crystal layer of the surface of the first oxide semiconductor layer as a seed.

In the first heat treatment, crystal growth is performed from the surface in the state where a crystal layer serving as a seed of crystal growth does not exist; whereas in the second heat treatment, the plate-shaped single crystal layer serving as a seed exists. Therefore, it is preferable that the second heat treatment be performed for a long time at a lowest temperature at which crystal growth can be performed because favorable crystallinity can be obtained. The crystal-growth direction obtained by the second heat treatment corresponds to an upward direction from a lower portion, i.e., a direction from the substrate side to the surface side (also referred to as recrystallization direction) and is different from that in the first heat treatment. In addition, since the single crystal layer obtained by the first heat treatment is heated again by the second heat treatment, the crystallinity of the single crystal layer is further increased.

FIG. 1A illustrates a state after first heat treatment for crystallization is performed on a first oxide semiconductor layer formed over a base component 500.

A structure which corresponds to FIG. 1B was manufactured actually. A TEM photograph of a cross section of the structure is shown in FIG. 4A. Note that a schematic view thereof is illustrated in FIG. 4B. Note that the TEM photograph was taken by a high resolution transmission electron microscope ("H9000-NAR" manufactured by Hitachi, Ltd.: TEM) at a high magnification (eight-million-fold magnification) and an accelerating voltage of 300 kV. A sample of the photograph of FIG. 4A was taken was formed in such a manner that an insulating layer was formed over a glass substrate, a first In—Ga—Zn—O film with a thickness of 5 nm was formed thereover, and heat treatment was performed thereon in a dry air atmosphere at 700° C. for one hour. It can be found from FIG. 4A that the first In—Ga—Zn—O film is c-axis-aligned perpendicularly to a surface of the first In—Ga—Zn—O film, and that the first In—Ga—Zn—O film in the vicinity of an interface between the insulating layer and the first In—Ga—Zn—O film is also crystallized and c-axis-aligned perpendicularly to the surface. As illustrated in FIG. 1A, a first oxide crystal component 501 which is a plate-shaped single crystal is formed over the base component. The plate-shaped single crystal is a crystal of $InGaZnO_4$. Note that elements adjacent to each other on the a-b plane are the same. In addition, the c-axis direction of the first oxide crystal component corresponds to the depth direction.

The first In—Ga—Zn—O film in the sample for FIG. 4A was deposited using a target for an oxide semiconductor (a target for an In—Ga—Zn—O-based oxide semiconductor (In$_2$O$_3$:Ga$_2$O$_3$:ZnO=1:1:2 [molar ratio])) with a sputtering apparatus under the following conditions: the pressure was 0.6 Pa, the direct current (DC) power was 0.5 kW, the mixed atmosphere of oxygen and argon (the oxygen flow rate: 50 sccm; the argon flow rate: 50 sccm) was used, the substrate temperature was 200° C., and the deposition rate was 4 nm/min. In the case where the target for an oxide semiconductor is used, a single crystal of InGaZnO$_4$ can be easily obtained. Without limitation to the material and the component of the target, for example, when a target containing In$_2$O$_3$, Ga$_2$O$_3$, and ZnO at 1:1:1 [molar ratio] is used, a single crystal of In$_2$Ga$_2$ZnO$_7$ can be easily obtained.

The crystal structures of In$_2$Ga$_2$ZnO$_7$ and InGaZnO$_4$ include any of In, Ga, and Zn, and can be considered to have a stacked-layer structure of layers parallel to a-axis and b-axis. Since electrical conductivity of the crystals of InGaZnO$_4$ or In$_2$Ga$_2$ZnO$_7$ is controlled mainly by In, electric characteristics of the layer containing In which are related to a direction parallel to the a-axis and the b-axis are favorable. In the crystal of InGaZnO$_4$ and the crystal of In$_2$Ga$_2$ZnO$_7$, electron clouds of In overlap with each other and are connected to each other, so that a carrier path is formed.

Instead of the above target, a metal oxide target containing In$_2$O$_3$, Ga$_2$O$_3$, and ZnO at 2:1:8 [molar ratio] may be used.

In addition, a metal oxide target containing In$_2$O$_3$ and ZnO at 1:2 [molar ratio], which does not include Ga, may be used. If a bottom-gate transistor is formed, since an oxide of Ga is an insulator, higher field-effect mobility can be obtained with the use of an In—Zn—O film as compared to the case of using the first In—Ga—Zn—O film. Note that the term "In—Ga—Zn—O film" indicates that the In—Ga—Zn—O film is an oxide material containing In, Ga, and ZnO, the contents of In, Ga, and ZnO can be set freely, and the Ga content may become 0 and the In content and the Zn content do not become 0.

FIG. 1B illustrates a cross sectional view at the time just after a second oxide component 502 is deposited. The second oxide component 502 is formed by a sputtering method, and as a metal oxide target for this formation, a metal oxide target containing In$_2$O$_3$, Ga$_2$O$_3$, and ZnO at 1:1:2 [molar ratio] or a metal oxide target containing In$_2$O$_3$, Ga$_2$O$_3$, and ZnO at 1:1:4 is used.

The substrate may be heated to a temperature higher than or equal to 200° C. and lower than or equal to 600° C. during the deposition of the second oxide component 502 by a sputtering method. When the deposition is performed at this substrate temperature, pre-alignment of the second oxide component 502 can be performed. Alternatively, epitaxial growth can be performed directly.

FIG. 1C illustrates a cross sectional view at the time after the second heat treatment. By the second heat treatment, crystal growth proceeds upward toward a surface of the second oxide component 502 with the use of the single crystal layer of the first oxide crystal component 501 as a seed. As a result, a second oxide crystal component 503b is formed, so that all the crystal components have the same crystal structures.

In addition, the single crystal layer obtained by the first heat treatment is heated again by the second heat treatment to be a third oxide crystal component 503a whose crystallinity is further increased.

The second heat treatment can also be called dehydration or dehydrogenation which is for detaching H, OH, or the like from the oxide semiconductor layer. In the case where temperature is raised in an inert atmosphere and the atmosphere is switched to an atmosphere containing oxygen, or in the case where an oxygen atmosphere is employed, the second heat treatment can also be called additional oxidation treatment.

The hydrogen concentration of each of the oxide semiconductor layers is less than or equal to $1\times10^{18}$ cm$^{-3}$, preferably less than or equal to $1\times10^{16}$ cm$^{-3}$, still more preferably substantially 0. In addition, the carrier density of each of the oxide semiconductor layers is less than $1\times10^{12}$ cm$^{-3}$, preferably less than $1.45\times10^{10}$ cm$^{-3}$ which is less than or equal to the measurement limit. That is, the carrier density in the oxide semiconductor film is as close to zero as possible. Furthermore, the band gap of the oxide semiconductor layer is greater than or equal to 2 eV, preferably greater than or equal to 2.5 eV, more preferably greater than or equal to 3 eV. Note that the hydrogen concentrations in the oxide semiconductor layer can be measured by secondary ion mass spectrometry (SIMS). The carrier density can be measured by the Hall effect measurement. In addition, a lower carrier density can be measured by a result of capacitance-voltage (CV) measurement and Formula 1.

$$N_d = -\left(\frac{2}{e\varepsilon_0\varepsilon}\right) \bigg/ \frac{d(1/C)^2}{dV} \quad \text{[Formula 1]}$$

In addition, it can be said that the structure illustrated in FIG. 1C is a two-layer structure in which the third oxide crystal component 503a is provided on and in contact with the base component 500 and the second oxide crystal component 503b is stacked thereover. There are no particular limitations on materials of the first oxide crystal component 501 and the second oxide component 502 as long as a single crystal which is c-axis-aligned perpendicularly to the surface can be obtained. The materials of the first oxide crystal component 501 and the second oxide component 502 may be different or may contain the same components. "Containing the same components" means that the same element is included therein.

Note that in the case where oxide semiconductor materials containing the same components are used, a boundary between the third oxide crystal component 503a and the second oxide crystal component 503b is unclear as illustrated by a dotted line in FIG. 1C, so that a single-layer structure is obtained.

In this manner, the single crystal layer formed of a stack of the third oxide crystal component 503a and the second oxide crystal component 503b can be obtained by crystal growth by separately performing two heat treatments.

Note that in FIG. 1A, crystal growth of the single crystal layer whose crystal direction is relatively aligned at the surface of the first oxide semiconductor layer proceeds in the depth direction from the surface; therefore, the single crystal layer can be formed without being influenced by the base component.

An example of a mechanism in which the crystal layer whose crystal direction is relatively aligned is formed on the surface of the first oxide semiconductor layer, for example, of the In—Ga—Zn—O film is described. By heat treatment, zinc included in the In—Ga—Zn—O film is dispersed and concentrated at the vicinity of the surface, and becomes a seed of crystal growth. At the time of the crystal growth, crystal growth in the horizontal direction (a direction parallel to the surface) strongly proceeds than crystal growth in the depth direction (a direction perpendicular to the surface); therefore, the plate-shaped single crystal layer is formed. That is, the first oxide semiconductor layer is more likely crystallized in the direction of the a-b plane than in the direction of the c-axis. In addition, crystal growth in the horizontal direction proceeds infinitely. In addition, since a space above the surface of the In—Ga—Zn—O film is a free space, crystal growth proceeding upward in this free space does not occur. These are supposed from the fact that when TDS measurement is performed to 450° C., peaks of In and Ga are not detected but a peak of zinc is detected in a vacuum-heat condition, in particular at around 300° C. Note that it can be confirmed that the TDS measurement is performed in vacuum and detachment of zinc is detected from a temperature around 200° C.

As a comparative example, a sample is formed. The sample is formed in such a manner that an In—Ga—Zn—O film with a thickness of 50 nm is formed and subjected to heating at 700° C. for one hour. A TEM photograph of a cross section of the sample is shown in FIG. 5A. Note that a schematic view thereof is illustrated in FIG. 5B. Note that the TEM photograph shown in FIG. 5A is taken by a high resolution transmission electron microscope ("H9000-NAR" manufactured by Hitachi, Ltd.: TEM) at a high magnification (two-million-fold magnification) and an accelerating voltage of 300 kV. From FIG. 5A, it can be found that a region from the surface of the In—Ga—Zn—O film to a depth of about 5 nm is crystallized, and a large number of amorphous portions and a plurality of crystals whose crystal directions are not aligned exist randomly in the In—Ga—Zn—O film. Accordingly, it can be said that even when the In—Ga—Zn—O film is deposited to such a large thickness as 50 nm and then subjected to heat treatment once at 700° C. that is higher than 650° C., for one hour that is longer than 6 minutes, it is difficult to obtain a crystal layer whose crystal direction is highly aligned as a whole.

From these results, it can be said that a single crystal layer having a large thickness can be formed in such a manner that two depositions are performed so that a single crystal layer to be a seed of crystal growth is formed and then a film is deposited again, and then crystal growth is performed. Accordingly, it is found that the method disclosed in this specification is extremely effective. By performing deposition twice and performing heat treatment twice, a single crystal layer whose crystal direction is highly aligned, i.e., a thick single crystal layer which has the a-b plane parallel to the surface of the single crystal layer and is c-axis-aligned perpendicularly to the surface of the single crystal layer can be obtained.

One embodiment of the present invention disclosed in this specification is a stacked oxide material including a first oxide crystal component whose crystal growth proceeds from a surface to an inside, over and at least partly in contact with a base component; and a second oxide crystal component over the first oxide crystal component. Note that the first oxide crystal component which grows from the surface toward the inside has an a-b plane along the surface of the first oxide crystal component and is c-axis-aligned perpendicularly to the surface of the first oxide crystal component.

Another embodiment of the present invention is a stacked oxide material including a first oxide crystal component over and at least partly in contact with a base material, and a second oxide crystal component on and in contact with the first oxide crystal component. In this embodiment, the first oxide crystal component and the second oxide crystal component have the same crystal axes.

Another embodiment of the present invention is a stacked oxide material including a first oxide crystal component over and at least partly in contact with a base component, and a second oxide crystal component on and in contact with the first oxide crystal component. In this embodiment, the first oxide crystal component and the second oxide crystal component are one single crystal.

In the above structure, the first oxide crystal component and the second oxide crystal component each have an a-b plane parallel to the surface thereof and are c-axis-aligned perpendicularly to the surface.

In the above structure, the base component includes an insulator surface, an oxide surface, a nitride surface, or a metal surface. Regardless of the material of the base component, a crystal layer which has an a-b plane parallel to the surface thereof and is c-axis-aligned perpendicularly to the surface thereof can be obtained.

Another embodiment of the present invention is a method for manufacturing a semiconductor device, including the steps of forming a gate electrode layer including a flat surface over a base surface, forming a gate insulating layer over the gate electrode layer; forming a first oxide semiconductor layer over the gate insulating layer, causing crystal growth which proceeds from a surface toward an inside of the first oxide semiconductor layer by heat treatment to form a first single crystal layer, forming a second oxide semiconductor layer over the first single crystal layer, causing crystal growth which proceeds from the first single crystal layer toward a surface of the second oxide semiconductor layer thereover by second heat treatment to form a second single crystal layer, and forming a source electrode layer and a drain electrode layer over a stack of the first crystal layer and the second single crystal layer.

Another embodiment of the present invention is a method for manufacturing a semiconductor device, including the steps of forming a gate electrode layer including a flat surface over a base component, forming a gate insulating layer over the gate electrode layer, forming a first oxide semiconductor layer over the gate insulating layer, causing crystal growth which proceeds from a surface toward an inside of the first oxide semiconductor layer by first heat treatment to form a first single crystal layer, forming a second oxide semiconductor layer over the first single crystal layer, causing crystal growth which proceeds from the first single crystal layer toward a surface of the second oxide semiconductor layer thereover by second heat treatment to form a second single crystal layer, and forming a source electrode layer and a drain electrode layer over a stack of the first single crystal layer and the second single crystal layer. In this embodiment, an edge portion of the gate electrode layer and the source electrode layer or the drain electrode layer overlap with each other, and a portion where the edge portion of the gate electrode layer and the source electrode layer or the drain electrode layer overlap with each other is positioned over the flat portion of the gate electrode layer.

In the above method for manufacturing a semiconductor device, the first single crystal layer has an a-b plane along the surface thereof and is c-axis-aligned perpendicularly to the surface thereof. In the above method for manufacturing a semiconductor device, the second single crystal layer has an a-b plane along the surface thereof and is c-axis-aligned perpendicularly to the surface thereof.

In the above method for manufacturing a semiconductor device, the first single crystal layer and the second single crystal layer are c-axis-aligned.

In the above method for manufacturing a semiconductor device, the second oxide semiconductor layer has a larger thickness than the first oxide semiconductor layer.

In the above method for manufacturing a semiconductor device, the first oxide semiconductor layer and the second oxide semiconductor layer have the same electron affinity.

Another embodiment of the present invention is a semiconductor device including: a gate electrode layer including a flat surface over a base surface, a gate insulating layer over the gate electrode layer, a first single crystal layer which is over and at least partly in contact with the gate insulating layer, has an a-b plane along the surface thereof and is c-axis-aligned perpendicularly to the surface thereof, a second single crystal layer which is on and in contact with the first single crystal layer, has an a-b plane along the surface thereof and is c-axis-aligned perpendicularly to the surface thereof, and a source electrode layer and a drain electrode layer over a stack of the first single crystal layer and the second single crystal layer. In this embodiment, the first single crystal layer and the second single crystal layer are metal oxide layers.

Another embodiment of the present invention is a semiconductor device including: a gate electrode layer including a flat surface over a base component, a gate insulating layer over the gate electrode layer, a first single crystal layer which is at least partly in contact with the gate insulating layer, has an a-b plane along the surface thereof and is c-axis-aligned perpendicularly to the surface thereof, a second single crystal layer which is on and in contact with the first single crystal layer, has an a-b plane along the surface thereof and is c-axis-aligned perpendicularly to the surface thereof, and a source electrode layer and a drain electrode layer over a stack of the first single crystal layer and the second single crystal layer. In this embodiment, the source electrode layer or the drain electrode layer is provided so as to be over the flat portion of the gate electrode layer, and the source electrode layer or the drain electrode layer overlaps with the gate electrode layer.

In each of above structures of the semiconductor device, the second single crystal single crystal layer has a larger thickness than the first single crystal layer.

In each of the above structures of the semiconductor device, the first single crystal layer and the second single crystal layer are c-axis aligned.

In each of the above structures of the semiconductor device, the first single crystal layer and the second single crystal layer have the same electron affinity or the first single crystal layer and the second single crystal layer are formed using different materials.

In each of the above structures of the semiconductor device, a difference in height at a region in the surface of the second single crystal layer which overlaps with the gate electrode layer is less than or equal to 1 nm, preferably less than or equal to 0.2 nm.

A device formed using a metal oxide, typically an In—Ga—Zn—O film is totally different from a device formed using a single crystal Si, a device formed using SiC, and a device formed using GaN.

As wide-gap semiconductors, SiC (3.26 eV) and GaN (3.39 eV) are known. However, SiC and GaN are expensive materials. In addition, when SiC is used, a temperature higher than or equal to 1700° C. is needed for activation after doping with phosphorus or aluminum in order to selectively form a low-resistance region. In addition, in order to perform epitaxial growth of GaN, epitaxial-growth process in which heating at a temperature higher than or equal to 1200° C. is performed for a long time is performed. That is, when SiC or GaN is used, a process temperature higher than or equal to 1000° C. is needed; therefore, it is substantially impossible to thinly form SiC or GaN over a glass substrate.

Further, the crystal structure of SiC or GaN is only a single crystal. Therefore, control with a PN junction is needed and more complete single-crystallization is needed. Accordingly, since a small amount of impurities which are unintentionally mixed in a manufacturing process serve as donors or acceptors, the carrier concentration has lower limit. On the other hand, a metal oxide can have any of an amorphous structure, a polycrystalline structure, and a single crystalline structure. One feature of a metal oxide is that control of a band which is equivalent to a PN junction is performed by utilizing each of properties of $\phi_{MS}$ versus $\chi_{OS}+\frac{1}{2}Eg^{OS}$, $\phi_{MD}$ versus $\chi_{OS}+\frac{1}{2}Eg^{OS}$, work functions of a source and a drain, electron affinity of metal oxide, and energy band width, without using control with a PN junction.

A metal oxide, typically an In—Ga—Zn—O film has a band gap which is three times as wide as that of single crystal silicon and is an inexpensive material because of a low manufacturing cost as compared with SiC.

The band gap of In—Ga—Zn—O is 3.05 eV, and an intrinsic carrier density is calculated based on this value. It is known that energy distribution f(E) of electrons in a solid depends on the Fermi-Dirac statistics represented by the following formula.

[Formula 2]

$$f(E) = \frac{1}{1 + \exp\left(\frac{E - E_F}{kT}\right)} \quad (1)$$

In the case of a normal semiconductor whose carrier density is not very high (which does not degenerate), the following relational expression is satisfied.
[Formula 3]

$$|E - E_F| > kT \quad (2)$$

Therefore, the Fermi-Dirac distribution of the formula (1) is close approximated by a formula of Boltzmann distribution represented by the following formula.

[Formula 4]

$$f(E) = \exp\left[-\frac{E - E_F}{kT}\right] \quad (3)$$

When an intrinsic carrier density ($n_i$) is calculated by the formula (3), the following formula can be obtained.

[Formula 5]

$$n_i = \sqrt{N_C N_V} \exp\left(-\frac{E_g}{2kT}\right) \quad (4)$$

Then, the values of effective density of states (Nc and Nv) and a band gap (Eg) of Si and In—Ga—Zn—O is substituted into the expression (4) and an intrinsic carrier density is calculated. The results are shown in Table 1.

TABLE 1

|  | Si | IGZO |
|---|---|---|
| Nc (300 K) [cm$^{-3}$] | $2.8 \times 10^{19}$ | $5.0 \times 10^{18}$ |
| Nv (300 K) [cm$^{-3}$] | $1.04 \times 10^{19}$ | $5.0 \times 10^{18}$ |
| Eg (300 K) [eV] | 1.08 | 3.05 |
| $n_i$ (300 K) [cm$^{-3}$] | $1.45 \times 10^{10}$ | $1.2 \times 10^{-7}$ |

It is found that In—Ga—Zn—O has extremely low intrinsic carrier density as compared to Si. In the case where the value of 3.05 eV is selected as a band gap of IGZO, it can be said that the carrier density of Si is approximately $10^{17}$ times as large as that of In—Ga—Zn—O, assuming that the Fermi-Dirac distribution law is applicable to the intrinsic carrier density.

In the case of an oxide semiconductor, a thin oxide semiconductor film can be formed by a sputtering method at a heating temperature from a room temperature to 400° C. and a maximum process temperature can be set to a temperature higher than or equal to 300° C. and lower than or equal to 800° C. In the case where the maximum process temperature is set to a temperature lower than or equal to the strain point of glass, a thin oxide semiconductor film can be formed over a large-area glass substrate. Therefore, it is important for industrialization to manufacture a metal oxide whose band gas is wide, employing a maximum process temperature higher than or equal to 300° C. and lower than or equal to 800° C.

In addition, in the case of forming a three-dimensional silicon integrated circuit, since a process temperature of an oxide semiconductor is lower than a temperature at which junction at a bottom side (a silicon side) is broken, application to a three-dimension integrated circuit which includes a silicon integrated circuit and an oxide semiconductor circuit thereover is possible.

A metal oxide which has been reported so far is only the one in an amorphous state, the one in a polycrystalline state, or the one in a single-crystalline state which is obtained through treatment at a high temperature as approximately 1500° C. However, as described above, a thin single crystal film which is c-axis-aligned can be formed at a relatively low temperature with a method in which a plate-shaped single crystal of a metal oxide is formed and then crystal growth is performed using the plate-shaped single crystal of the metal oxide as a seed. Further, if formation of a thicker single crystal film is possible, industrial application is further expanded. Note that in order to obtain a fine thick single crystal film, flatness and smoothness of the substrate are preferably high. This is because small unevenness of the substrate leads to local shift of the c-axis, which results in defects such as crystal transition due to a difference in the c-axis direction between adjacent crystals as crystal growth proceeds.

A metal oxide film is formed by two depositions and heat treatment is performed twice, whereby a thick single crystal layer, that is, a crystal layer which is c-axis-aligned perpendicularly to a surface of the film can be obtained even when any of an oxide, a nitride, a metal or the like is used for a material of a base component. In addition, when a stack-type device is manufactured, a single crystal layer can have a larger thickness, that is, a thickness greater than or equal to 1 µm and less than or equal to 10 µm can be obtained. In addition, with the use of an oxide semiconductor layer including the c-axis-aligned crystal layer, variety of devices, such as power devices mounted on a power supply circuit; semiconductor integrated circuits including a memory, a thyristor, a converter, an image sensor, or the like; electro-optical devices typified by liquid crystal display panels; or light-emitting devices including an organic light-emitting element can be manufactured.

Note that with the use of the oxide semiconductor layer including the c-axis-aligned crystal layer, a transistor with high field-effect mobility can be obtained. In addition, a transistor with low off current can be obtained. In addition, a so-called normally-off switching element can be obtained, so that a semiconductor device with low power consumption can be provided.

Further, in the transistor formed using the oxide semiconductor layer including the c-axis-aligned crystal layer, the amount of change in the threshold voltage of the transistor before and after a BT test can be suppressed, so that high reliability can be achieved. In addition, in the transistor formed using the oxide semiconductor layer including the c-axis-aligned crystal layer, the amount of change in threshold voltage of the transistor between before and after a BT test in which the transistor is continuously irradiated with light can be reduced. As a result, the transistor with stable electric characteristics can be manufactured.

Furthermore, in the device formed using the oxide semiconductor layer including the c-axis-aligned crystal layer, temperature dependence of electric characteristics of the device can be suppressed.

BRIEF DESCRIPTION OF DRAWINGS

In the accompanying drawings:

FIGS. 4A and 4B are a cross-sectional TEM photograph and a schematic view thereof.

FIGS. 5A and 5B are a cross-sectional TEM photograph of a comparative example and a schematic view thereof;

FIG. 6 is a longitudinal sectional view of a bottom-gate transistor using an oxide semiconductor;

FIGS. 11A1 and 11A2 and FIG. 11B are top views and a cross-sectional view of an embodiment of the present invention;

FIGS. 12A and 12B are a top view and a cross-sectional view of an embodiment of the present invention;

BEST MODE FOR CARRYING OUT THE INVENTION

Figure 1A:
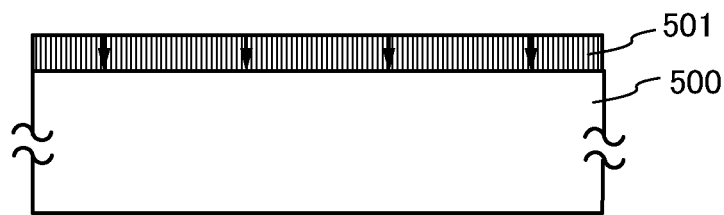
FIGS. 1A to 1C are cross-sectional views of an embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

[Embodiment 1]

In this embodiment, an example of manufacturing a transistor is described with reference to FIGS. 1A to 1C, FIGS. 2A to 2E, and FIGS. 3A and 3B.

First, a conductive film is formed over a substrate 400 which is a substrate having an insulating surface, and then a gate electrode layer 401 is provided using a photolithography step with the use of a photomask.

As the substrate 400, although a semiconductor substrate, a sapphire substrate, a quartz substrate, a ceramic substrate, and the like are given, a glass substrate which enables mass production is preferably used, in particular. As a glass substrate used for the substrate 400, a glass substrate whose strain point is higher than or equal to 730° C. may be used when the temperature of the heat treatment to be performed is high. For the substrate 400, for example, a glass material such as aluminosilicate glass, aluminoborosilicate glass, or barium borosilicate glass is used. Note that by containing a larger amount of barium oxide (BaO) than boron oxide, a heat-resistant glass substrate which is of more practical use can be formed. Therefore, a glass substrate which contains BaO and $B_2O_3$ so that the amount of BaO is larger than that of $B_2O_3$ is preferably used.

An insulating layer serving as a base layer may be provided between the substrate 400 and the gate electrode layer 401. The base layer has a function of preventing diffusion of an impurity element from the substrate 400, and can be formed with a single-layer or stacked-layer structure using one or more of a silicon nitride layer, a silicon oxide layer, a silicon nitride oxide layer, and a silicon oxynitride layer.

A metal conductive layer can be used as the gate electrode layer 401. As the material of the metal conductive layer, an element selected from Al, Cr, Cu, Ta, Ti, Mo, and W, an alloy containing any of these elements as a component, an alloy containing any of these elements in combination, or the like is preferably used. For example, a three-layer structure in which an aluminum layer is stacked over a titanium layer and a titanium layer is stacked over the aluminum layer, or a three-layer structure in which an aluminum layer is stacked over a molybdenum layer and a molybdenum layer is stacked over the aluminum layer is preferable. Needless to say, the metal conductive layer may have a single-layer structure, a two-layer structure, or a structure in which four or more layers are stacked. In the case where heat treatment is performed later, a material which can withstand a temperature of the heat treatment is preferably selected for the gate electrode layer 401.

Next, a gate insulating layer 402 is formed over the gate electrode layer 401. The gate insulating layer 402 can be formed to have a single layer of a silicon oxide layer, a silicon nitride layer, a hafnium oxide layer, a silicon oxynitride layer, or a silicon nitride oxide layer, or a stacked layer thereof by a plasma CVD method, a sputtering method, or the like. For example, a stack including a silicon nitride film and a silicon oxide film is used. The thickness of the gate insulating layer 402 is greater than or equal to 50 nm and less than or equal to 200 nm.

In this embodiment, the gate insulating layer 402 is formed using a high-density plasma apparatus. Here, a high-density plasma apparatus refers to an apparatus which can realize a plasma density higher than or equal to $1 \times 10^{11}/cm^3$. For example, plasma is generated by applying a microwave power higher than or equal to 3 kW and lower than or equal to 6 kW so that the insulating film is formed.

A monosilane gas ($SiH_4$), nitrous oxide ($N_2O$), and a rare gas are introduced into a chamber as a source gas to generate high-density plasma at a pressure higher than or equal to 10 Pa and lower than or equal to 30 Pa so that the insulating film is formed over a substrate having an insulating surface, such as a glass substrate. After that, the supply of a monosilane gas is stopped, and nitrous oxide ($N_2O$) and a rare gas are introduced into the chamber without exposure to the air, so that plasma treatment may be performed on a surface of the insulating film. The plasma treatment performed on the surface of the insulating film by introducing nitrous oxide ($N_2O$) and a rare gas is performed at least after the insulating film is formed. The insulating film formed through the above process procedure has small thickness and corresponds to an insulating film whose reliability can be ensured even though it has a thickness less than 100 nm, for example.

In forming the gate insulating layer 402, the flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

In addition, since the insulating film formed by using the high-density plasma apparatus can have certain thickness, the insulating film has excellent step coverage. Further, as for the insulating film formed by using the high-density plasma apparatus, the thickness of a thin film can be controlled precisely.

The insulating film formed through the above process procedure is greatly different from the insulating film formed using a conventional parallel plate PCVD apparatus. The etching rate of the insulating film formed through the above process procedure is lower than that of the insulating film formed using the conventional parallel plate PCVD apparatus by 10% or more or 20% or more in the case where the etching rates with the same etchant are compared to each other. Thus, it can be said that the insulating film formed using the high-density plasma apparatus is a dense film.

In this embodiment, a silicon oxynitride film (also referred to as $SiO_xN_y$, where $x>y>0$) with a thickness of 100 nm formed using the high-density plasma apparatus is used as the gate insulating layer 402.

Then, a first oxide semiconductor layer is formed to a thickness greater than or equal to 2 nm and less than or equal to 15 nm over the gate insulating layer 402. The first oxide semiconductor layer can be formed by a sputtering method in a rare gas (typically, argon) atmosphere, an oxygen atmosphere, or a mixed atmosphere including a rare gas (typically, argon) and oxygen.

In addition, it is preferable that moisture or the like which exists in the sputtering apparatus is removed before, during, or after deposition of the oxide semiconductor film. In order to remove moisture in the sputtering apparatus, an adsorption-type vacuum pump is preferably used. For example, a cryopump, an ion pump, or a titanium sublimation pump is preferably used. The evacuation unit can be a turbo pump provided with a cold trap. In the sputtering apparatus which is evacuated with the cryopump, a hydrogen atom, a compound containing a hydrogen atom, such as water ($H_2O$), and the like are removed, whereby the concentration of an impurity in the oxide semiconductor film formed in the deposition chamber can be reduced.

As the first oxide semiconductor layer, the following oxide semiconductor films can be given: a four-component metal oxide such as an In—Sn—Ga—Zn—O film, a three-component metal oxide such as an In—Ga—Zn—O film, an In—Sn—Zn—O film, an In—Al—Zn—O film, a Sn—Ga—Zn—O film, an Al—Ga—Zn—O film, and a Sn—Al—Zn—O film, a two-component metal oxide such as an In—Zn—O film, a Sn—Zn—O film, an Al—Zn—O film, a Zn—Mg—O film, a Sn—Mg—O film, and an In—Mg—O film, or a single-component metal oxide such as an In—O film, a Sn—O film, and a Zn—O film.

In addition, as the first oxide semiconductor layer, a thin film expressed by $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like.

In this embodiment, the first oxide semiconductor layer is formed to a thickness of 5 nm in an oxygen atmosphere, an argon atmosphere, or a mixed atmosphere of argon and oxygen under conditions that a target for an oxide semiconductor (a target for an In—Ga—Zn—O-based oxide semiconductor containing $In_2O_3$, $Ga_2O_3$, and ZnO at 1:1:2 [molar ratio]) is used, the distance between the substrate and the target is 170 mm, the pressure is 0.4 Pa, and the direct current (DC) power source is 0.5 kW. As the target for an oxide semiconductor, a target having a composition ratio of $In_2O_3$:$Ga_2O_3$:ZnO=1:1:1 [molar ratio] or a target having a composition ratio of $In_2O_3$:$Ga_2O_3$:ZnO=1:1:4 [molar ratio] can also be used. In this embodiment, it is preferable that a target for an oxide semiconductor which tends to be crystallized is used in order to intentionally perform crystallization by heat treatment performed later.

In addition, it is preferable that an oxide semiconductor contained in the target for an oxide semiconductor has a relative density of 80% or more, preferably 95% or more, more preferably 99.9% or more. The impurity concentration in the oxide semiconductor film which is formed using the target having high relative density can be reduced, and thus a thin film transistor having high electric characteristics or high reliability can be obtained.

Further, pre-heat treatment is preferably performed before the first oxide semiconductor layer is deposited, in order to remove moisture or hydrogen which exists on an inner wall of a sputtering apparatus, on a surface of the target, or inside a target material. As the pre-heat treatment, a method in which the inside of the deposition chamber is heated to higher than or equal to 200° C. and lower than or equal to 600° C. under reduced pressure, a method in which introduction and exhaust of nitrogen or an inert gas are repeated while the inside of the deposition chamber is heated, and the like can be given. After the pre-heat treatment, the substrate or the sputtering apparatus is cooled. Then, an oxide semiconductor film is formed without exposure to the air. In this case, not water but oil or the like is preferably used as a coolant for the target. Although a certain level of effect can be obtained when introduction and exhaust of nitrogen are repeated without heating, it is more preferable to perform the treatment with the inside of the deposition chamber heated.

Next, the first oxide semiconductor layer is subjected to first heat treatment, so that at least part thereof is crystallized. In the first heat treatment, a temperature higher than or equal to 450° C. and lower than or equal to 850° C., preferably higher than or equal to 600° C. and lower than or equal to 700° C. is employed. In addition, heating time is longer than or equal to 1 minute and shorter than or equal to 24 hours. By the first heat treatment, a first oxide semiconductor layer 403 that is a single crystal layer obtained by crystal growth proceeding from a surface is formed (see FIG. 2A). The crystal growth of the single crystal layer proceeds from the surface toward the inside and the single crystal layer is a plate-shaped crystal layer with an average thickness greater than or equal to 2 nm and less than or equal to 10 nm. Further, the crystal layer formed at the surface of the single crystal layer has an a-b plane along its surface and is c-axis-aligned perpendicularly to the surface of the crystal layer. In this embodiment, an example in which the whole first oxide semiconductor layer becomes a crystal (also referred to as a co-growing (CG) crystal) by the first heat treatment is described.

Note that in the first heat treatment, it is preferable that water, hydrogen, hydrocarbon and the like be not contained in nitrogen, oxygen, or a rare gas such as helium, neon, or argon. In addition, it is preferable that the purity of nitrogen, oxygen, or a rare gas such as helium, neon, or argon which is introduced to the heat treatment apparatus be 6N (99.9999%) or more, more preferably 7N (99.99999%) or more (that is, the impurity concentration is 1 ppm or lower, more preferably 0.1 ppm or lower). Further, the first heat treatment may be performed in a dry air atmosphere with an $H_2O$ concentration of lower than or equal to 20 ppm.

In this embodiment, heat treatment in a dry air atmosphere at 700° C. for one hour is performed as the first heat treatment.

In addition, when the temperature is increased in the first heat treatment, the inside of a furnace may be set to a nitrogen atmosphere, and when cooling is performed, the inside of the furnace may be switched to an oxygen atmosphere. By performing dehydration or dehydrogenation in a nitrogen atmosphere and switching the atmosphere to an oxygen atmosphere, oxygen can be supplied into the first oxide semiconductor layer, so that an i-type oxide semiconductor layer can be obtained.

Note that the apparatus used for the first heat treatment is not limited to a particular apparatus, and the apparatus may be provided with a device for heating an object to be processed by heat radiation or heat conduction from a heating element such as a resistance heating element. For example, an electric furnace, or a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

Figure 2A:
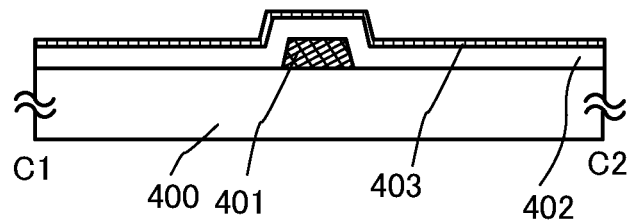
FIGS. 2A to 2E are cross-sectional process views of an embodiment of the present invention.
Figure 2B:
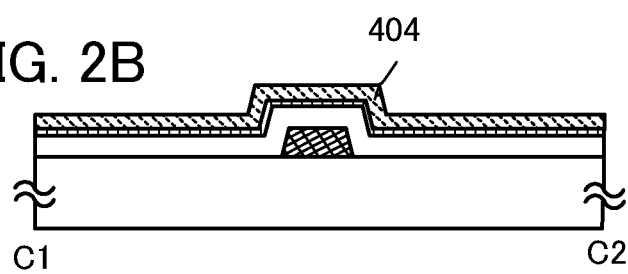

Next, a second oxide semiconductor layer 404 whose thickness is larger than at least that of the first oxide semiconductor layer 403 and less than or equal to 10 μm is formed over the first oxide semiconductor layer 403 that is a plate-shaped single crystal (see FIG. 2B). Note that a thickness suitable for a device to be manufactured may be employed as the thickness of the second oxide semiconductor layer 404 by practitioners appropriately. For example, in the case of manufacturing a bottom-gate transistor, the total thickness of the first oxide semiconductor layer 403 and the second oxide semiconductor layer 404 is greater than or equal to 10 nm and less than or equal to 200 nm. Further, for example, in the case of manufacturing an IGFET, the total thickness of the first oxide semiconductor layer 403 and the second oxide semiconductor layer 404 is greater than or equal to 10 nm and less than or equal to 50 nm. Further, the second oxide semiconductor layer can be formed by a sputtering method in a rare gas (typically, argon) atmosphere, an oxygen atmosphere, or an atmosphere containing a rare gas (typically, argon) and oxygen.

As the second oxide semiconductor layer 404, a four-component metal oxide such as an In—Sn—Ga—Zn—O film, a three-component metal oxide such as an In—Ga—Zn—O film, an In—Sn—Zn—O film, an In—Al—Zn—O film, a Sn—Ga—Zn—O film, an Al—Ga—Zn—O film, and a Sn—Al—Zn—O film, a two-component metal oxide such as an In—Zn—O film, a Sn—Zn—O film, an Al—Zn—O film, a Zn—Mg—O film, a Sn—Mg—O film, and an In—Mg—O film, or a single-component metal oxide such as an In—O film, a Sn—O film, and a Zn—O film can be used.

It is preferable that the first oxide semiconductor layer and the second oxide semiconductor layer 404 be formed using materials including the same components or have the same crystal structures and lattice constants close to each other (mismatch is less than or equal to 1%). In the case where the materials including the same components are used, crystal growth with the use of the single crystal layer of the first oxide semiconductor layer 403 as a seed is easily performed at the time of crystallization performed later. In addition, in the case where the materials including the same components are used, an interface property such as adhesion or electric characteristics is good.

Next, second heat treatment is performed, so that crystal growth is performed using the crystal layer of the first oxide semiconductor layer 403 as a seed. The second heat treatment is performed at a temperature higher than or equal to 450° C. and lower than or equal to 850° C., preferably higher than or equal to 550° C. and lower than or equal to 650° C. In addition, heating time is longer than or equal to 1 minute and shorter than or equal to 24 hours. By the second heat treatment, the second oxide semiconductor layer is crystallized. In this manner, a single crystal oxide semiconductor stack 430 can be obtained (see FIG. 2C).

Note that in the oxide semiconductor stack 430, a region overlapping with a step of the gate insulating layer has a crystal boundary and therefore has a polycrystalline structure. In addition, in the oxide semiconductor stack 430, a region serving as a channel formation region has at least a flat surface and has a single crystal structure in which the c-axis of the first oxide semiconductor layer and the c-axis of the second oxide semiconductor layer are aligned. In addition, in the oxide semiconductor stack 430, the a-axes and b-axes of polycrystals in the channel formation region each are misaligned in some cases. In the channel formation region, a-axes corresponding to each other and b-axes corresponding to each other are each aligned in the same direction in the a-b plane of crystals, in other words, a so-called single crystal is ideal.

Figure 1B:
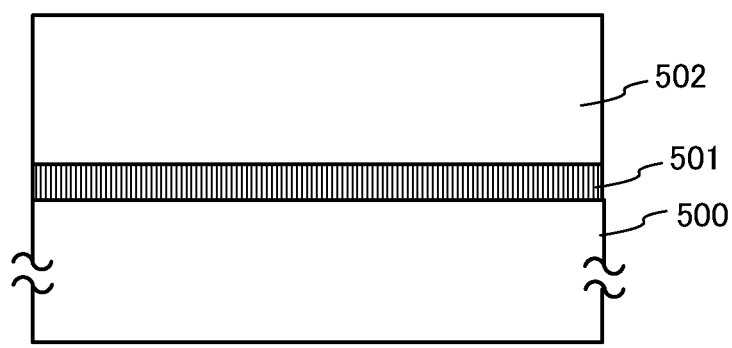
Figure 1C:
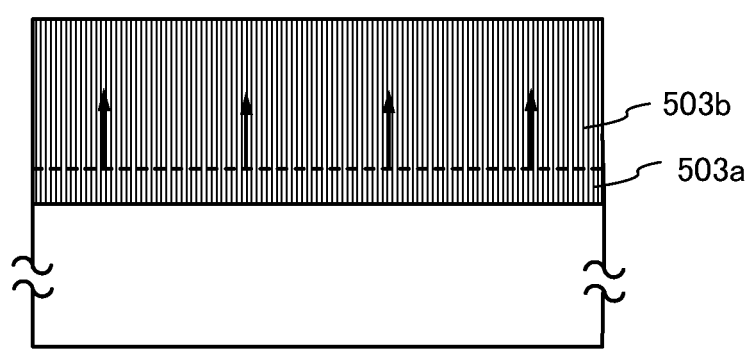
Figure 2C:
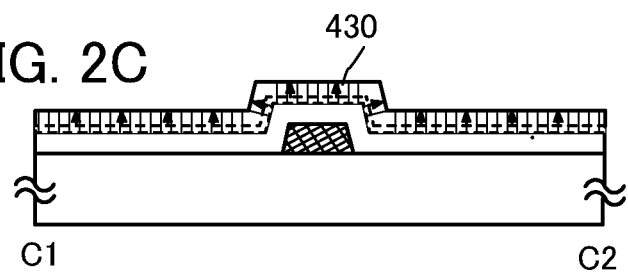

In order to describe a superordinate concept to easily understand steps of FIGS. 2A, 2B, and 2C, magnified schematic views are illustrated in FIGS. 1A, 1B, and 1C.

FIG. 1A illustrates a first oxide crystal component 501 which has been subjected to first heat treatment for crystallization over a base component 500. FIG. 1A corresponds to FIG. 2A and the base component 500 corresponds to the gate insulating layer 402. FIG. 1B corresponds to FIG. 2B and is a cross-sectional view at the time just after deposition of a second oxide component 502. FIG. 1C corresponds to FIG. 2C and is a cross-sectional view at the time after second heat treatment. By the second heat treatment, a first oxide crystal component 503a formed of a crystal layer whose crystal direction is highly aligned is obtained. In the case where the first oxide component and the second oxide component are formed using the oxide semiconductor materials including the same components, as illustrated in FIG. 1C, crystal growth proceeds upward toward a surface of the second oxide component with the use of a crystal layer of the first oxide crystal component 503a as a nucleus, and a second oxide crystal component 503b is formed, so that the crystal components have the same crystal structures. Therefore, a boundary between the first oxide crystal component and the second oxide crystal component is unclear although illustrated with a dotted line in FIG. 1C. In addition, by the second heat treatment, the inside of the second oxide component 502 which has just been deposited is highly purified to be a crystal region.

Note that also in the second heat treatment, it is preferable that water, hydrogen, and the like be not contained in nitrogen, oxygen, or a rare gas such as helium, neon, or argon. Alternatively, the purity of nitrogen, oxygen, or a rare gas such as helium, neon, or argon which is introduced into the heat treatment apparatus is preferably 6N (99.9999%) or more, more preferably 7N (99.99999%) or more (i.e., the impurity concentration is preferably 1 ppm or lower, more preferably 0.1 ppm or lower). Alternatively, the second heat treatment may be performed in ultra-dry air with an $H_2O$ concentration of 20 ppm or lower. When the temperature is increased in the second heat treatment, the inside of a furnace may be set to a nitrogen atmosphere, and when cooling is performed, the atmosphere of the inside may be switched to an oxygen atmosphere.

Note that the apparatus for the second heat treatment is also not limited to a particular apparatus, and the apparatus may be provided with a device for heating an object to be processed by heat radiation or heat conduction from a heating element such as a resistance heating element. For example, an electric furnace, or an RTA apparatus such as a GRTA apparatus or an LRTA apparatus can be used.

Figure 2D:
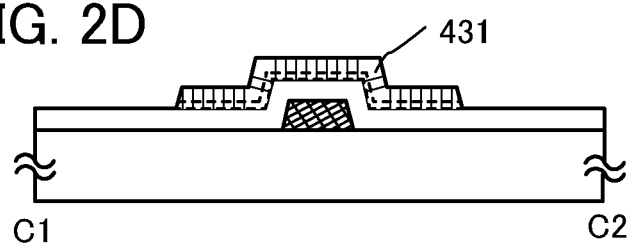

Next, the oxide semiconductor stack 430 formed from the first oxide semiconductor layer and the second oxide semiconductor layer is processed into an island-shaped oxide semiconductor stack 431 using a photolithography step (see FIG. 2D). Further, a resist mask for forming the island-shaped oxide semiconductor stack 431 may be formed using an inkjet method. Formation of the resist mask by an inkjet method needs no photomask; thus, manufacturing cost can be reduced.

Next, after a metal conductive film is formed over the gate insulating layer 402 and the island-shaped oxide semiconductor stack 431 by a sputtering method or the like, photolithography step is performed so that a resist mask is formed. Then, the metal conductive film is selectively etched, so that metal electrode layers are formed.

As the material of the metal conductive layer, which is to be a source electrode and a drain electrode (including a wiring formed using the same layer), a metal material such as Al, Cu, Cr, Ta, Ti, Mo, or W; or an alloy material whose main component is any of these metal materials is used. In addition, a structure in which a refractory metal such as Cr, Ta, Ti, Mo, and W is stacked on a lower side and/or an upper side of a metal layer of Al, Cu, or the like may be used. In addition, heat resistance can be improved by using an Al material to which an element such as Si, Ti, Ta, W, Mo, Cr, Nd, Sc, or Y which prevents generation of a hillock or a whisker generated in an Al film is added.

For example, the metal conductive film preferably has a three-layer structure in which an aluminum layer is stacked over a titanium layer and a titanium layer is stacked over the aluminum layer, or a three layer structure in which an aluminum layer is stacked over a molybdenum layer and a molybdenum layer is stacked over the aluminum layer. Alternatively, the metal conductive film can have a two-layer structure in which an aluminum layer and a tungsten layer are stacked, a two-layer structure in which a copper layer and a tungsten layer are stacked, or a two-layer structure in which an aluminum layer and a molybdenum layer are stacked. Needless to say, the metal conductive film may have a single-layer structure or a stacked-layer structure including four or more layers.

As the material of the metal conductive film which is to be the source electrode and the drain electrode (including the wiring formed using the same layer), a conductive metal oxide may be used. As the conductive metal oxide, indium oxide (In$_2$O$_3$), tin oxide (SnO$_2$), zinc oxide (ZnO), an alloy of indium oxide and tin oxide (In$_2$O$_3$—SnO$_2$, abbreviated to ITO), an alloy of indium oxide and zinc oxide (In$_2$O$_3$—ZnO), or any of the metal oxide materials containing silicon or silicon oxide can be used.

Then, the resist mask is removed, and a photolithography step is performed, so that a resist mask is formed. Then, selective etching is performed, so that a source electrode layer 405a and a drain electrode layer 405b are formed. After that, the resist mask is removed (see FIG. 2E). Note that in this photolithography step, in some cases, only part of the island-shaped oxide semiconductor stack 431 is etched, whereby an oxide semiconductor layer having a groove (a depression portion) is formed.

Figure 2E:
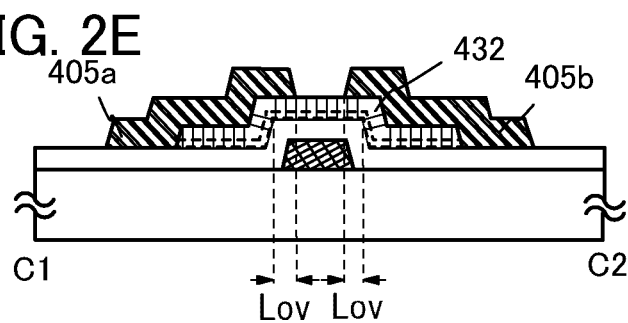

As illustrated in FIG. 2E, the gate electrode layer 401 includes a region overlapping with the source electrode layer 405a (and the drain electrode layer 405b), which is also one feature. A region between an edge portion of the source electrode layer 405a and a step of the gate insulating layer 402, in other words, a region between the edge portion of the source electrode layer 405a and a point at which a flat surface is changed to a surface of a tapered shape of the gate insulating layer in the cross-sectional view (here, an $L_{OV}$ region in FIG. 2E) is included. The $L_{OV}$ region of an oxide semiconductor stack 432 is important in view of preventing carriers from flowing to a crystal grain boundary generated due to the step of the edge portion of the gate electrode layer.

In addition, in a side surface of the oxide semiconductor stack 432, a crystal layer which is in contact with the source electrode layer 405a or the drain electrode layer 405b is in an amorphous state in some cases.

Further, a resist mask used for forming the source electrode layer 405a and the drain electrode layer 405b may be formed by an inkjet method. Formation of the resist mask by an inkjet method needs no photomask; thus, manufacturing cost can be reduced.

In order to reduce the number of photomasks used in a photolithography step and reduce the number of photolithography steps, an etching step may be performed with the use of a multi-tone mask which is a light-exposure mask through which light is transmitted to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

Next, an oxide insulating layer 407 serving as a protective insulating film is formed in contact with part of the oxide semiconductor layer.

The oxide insulating layer 407 can be formed to a thickness of at least 1 nm by a method by which impurities such as water or hydrogen does not enter the oxide insulating layer 407, such as a sputtering method, as appropriate. In this embodiment, a 300-nm-thick silicon oxide film is deposited as the oxide insulating layer 407 by sputtering. The substrate temperature in deposition may be higher than or equal to room temperature and lower than or equal to 300° C. and in this embodiment, is 100° C. The deposition of the silicon oxide film by a sputtering method can be performed in a rare gas (typically argon) atmosphere, an oxygen atmosphere, or an atmosphere of a rare gas (typically argon) and oxygen. As a target, a silicon oxide target or a silicon target may be used.

For example, with the use of a silicon target, silicon oxide can be formed by a sputtering method in an atmosphere of oxygen and nitrogen. As the oxide insulating layer 407 which is formed so as to be in contact with the oxide semiconductor layer whose resistance is reduced, an inorganic insulating film which does not include impurities such as moisture, a hydrogen ion, and OH$^-$ and blocks entry of these from the outside is used. Typically, a silicon oxide film, a silicon nitride oxide film, an aluminum oxide film, or an aluminum oxynitride film is used. Further, a protective insulating layer such as a silicon nitride film or an aluminum nitride film may be formed over the oxide insulating layer 407.

Further, pre-heat treatment is preferably performed before the oxide insulating layer 407 is formed, in order to remove moisture or hydrogen which exists on an inner wall of a sputtering apparatus, on a surface of the target, or inside a target material. After the pre-heat treatment, the substrate or the sputtering apparatus is cooled. Then, an oxide insulating layer is formed without exposure to the air. In this case, not water but oil or the like is preferably used as a coolant for the target. Although a certain level of effect can be obtained when introduction and exhaust of nitrogen are repeated without heating, it is more preferable to perform the treatment with the inside of the deposition chamber heated.

Further, after the deposition of the oxide insulating layer 407, a silicon nitride film may be stacked thereover by a sputtering method without exposure to the air.

Further, a contact hole reaching the gate electrode layer 401 is formed in the oxide insulating layer 407 and the gate insulating layer 402, and a connection electrode which is electrically connected to the gate electrode layer 401 and supplies a gate potential to the gate electrode layer 401 may be formed over the oxide insulating layer 407. Alternatively, the following may be employed: a contact hole reaching the gate electrode layer 401 is formed after formation of the gate insulating layer 402; a connection electrode is formed thereover using the same material as that of the source electrode layer and the drain electrode layer; the oxide insulating layer 407 is formed over the connection electrode; a contact hole reaching the connection electrode is formed in the oxide insulating layer 407; and then, an electrode which is electrically connected to the connection electrode and supplies a gate potential to the connection electrode is formed over the oxide insulating layer 407.

Figure 3A:
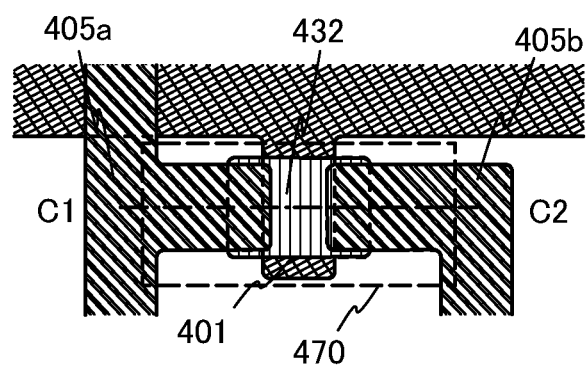
FIGS. 3A and 3B are a top view and a cross-sectional view of an embodiment of the present invention.
Figure 3B:
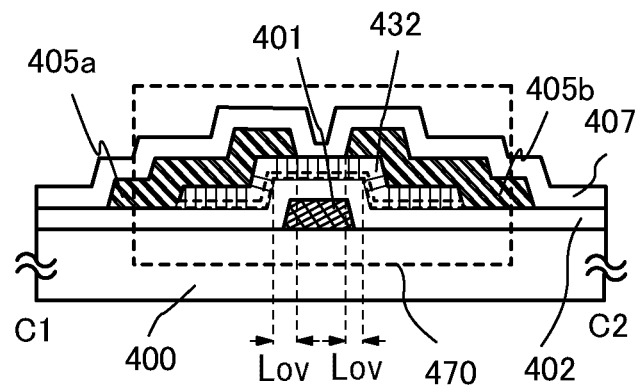

Through the above process, a transistor 470 is formed (see FIG. 3B). FIG. 3A illustrates an example of a top view of the transistor 470. Note that FIG. 3B corresponds to a cross-sectional view taken along a broken line C1-C2 in FIG. 3A.

One of features of the transistor 470 is that a top surface of the gate electrode which overlaps with the channel formation region is flat, an oxide component which is c-axis-aligned perpendicularly to the flat surface is included, and the source or the drain electrode layer overlaps with the step of the oxide component generated due to the edge portion of the gate electrode layer. In the case where there is a projection portion and a recessed portion on the substrate side, in the oxide component (the oxide semiconductor stack 432 in this embodiment), a region in which crystal growth meets the recessed portion becomes polycrystals including a crystal boundary. Accordingly, by forming the $L_{OV}$ region illustrated in FIG. 3B, carriers can be prevented from flowing to the crystal boundary generated in unevenness of the edge portion of the gate electrode layer. Therefore, in the transistor 470, the source electrode layer or the drain electrode layer is provide to be over the flat portion of the gate electrode layer to include a region overlap with the gate electrode layer.

Note that the transistor 470 includes a flat surface of the channel formation region which is in contact with the base component has a difference in height of less than or equal to 1 nm, preferably less than or equal to 0.2 nm. The channel formation region through which carriers flow is formed with a single crystal and it is preferable that the single crystal has an a-b plane in a direction in which carriers flow.

By the first heat treatment and the second heat treatment, crystallization is performed, hydrogen, which is an n-type impurity, is removed from an oxide semiconductor, and the oxide semiconductor is highly purified so that the oxide semiconductor includes impurities which are not the main component of the oxide semiconductor, as little as possible to be an intrinsic (i-type) or a substantially intrinsic semiconductor. In other words, a highly purified i-type (intrinsic) semiconductor, or a semiconductor close thereto, is obtained not by adding an impurity but by removing an impurity such as hydrogen or water as much as possible. By highly purifying the oxide semiconductor layer, the threshold voltage of the transistor becomes positive, so that a so-called normally-off transistor 470 can be obtained.

Needless to say, this embodiment is not particularly limited to the structure of the transistor 470 illustrated in FIG. 3B. Any structure may be acceptable as long as the transistor is a bottom-gate transistor. For example, in order to prevent etching damage at the time of formation of the source electrode layer and the drain electrode layer in FIG. 2E, a channel-stop structure in which an oxide insulating layer overlapping with a channel formation region is formed as a channel stopper may be employed for the transistor.

In addition, an electrode layer which can function as a back gate may be provided over the oxide insulating layer 407. The potential of the back gate can be a fixed potential, e.g., 0 V, or a ground potential, and may be determined as appropriate by practitioners. In addition, by providing the gate electrodes above and below the oxide semiconductor layer, in a bias-temperature stress test (hereinafter, referred to as a BT test) for examining reliability of a transistor, the amount of shift in threshold voltage of the transistor between before and after the BT test can be reduced. That is, by providing the gate electrodes above and below the oxide semiconductor layer, reliability can be improved. Further, by controlling gate voltage applied to the back gate, threshold voltage can be determined. Alternatively, when the threshold voltage is set positive, the transistor can function as an enhancement type transistor. Further alternatively, when the threshold voltage is set negative, the transistor can function as a depletion type transistor. For example, an inverter circuit including a combination of the enhancement type transistor and the depletion type transistor (hereinafter, such a circuit is referred to as an EDMOS circuit) can be used for a driver circuit. The driver circuit includes at least a logic circuit portion, and a switch portion or a buffer portion. The logic circuit portion has a circuit structure including the above EDMOS circuit.

A principle of operation of a bottom-gate transistor including an oxide semiconductor will be described below.

FIG. 6 is a longitudinal sectional view of a transistor including an oxide semiconductor. An oxide semiconductor layer (OS) is provided over a gate electrode (GE1) with a gate insulating film (GI) provided therebetween, and a source electrode (S) and a drain electrode (D) are provided thereover. In addition, a back gate (GE2) overlapping with a channel formation region of the oxide semiconductor layer (OS) is provided over an oxide insulating layer covering the source electrode (S) and the drain electrode (D).

Figure 7A:
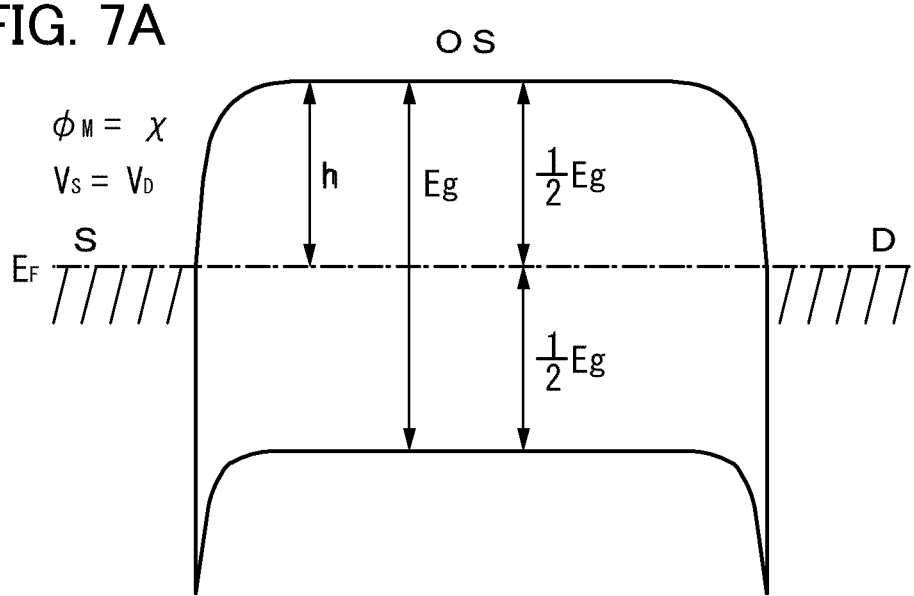
FIGS. 7A and 7B each are an energy band diagram (a schematic view) of a cross section taken along line A-A' in FIG. 6.
Figure 7B:
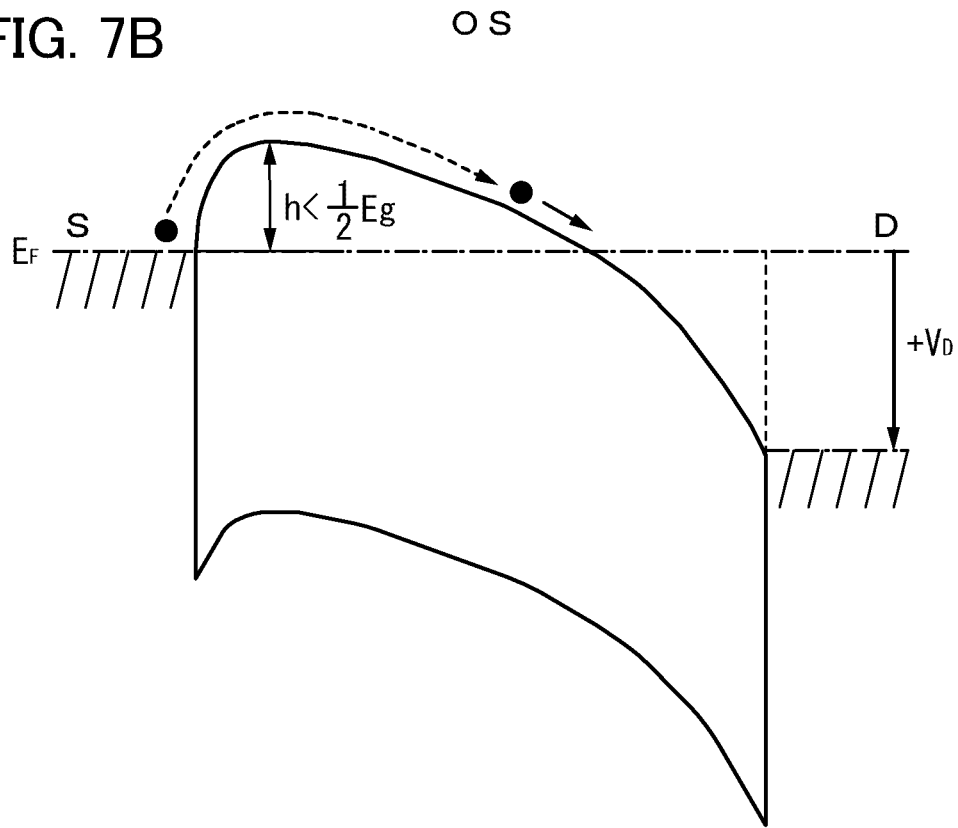

FIGS. 7A and 7B are energy band diagrams (schematic diagrams) along the cross section A-A' illustrated in FIG. 6.

FIG. 7A shows the case where the source and the drain have voltage of the same potential ($V_D=0$ V). FIG. 7B shows the case where positive potential is applied to the drain ($V_D>0$ V) whereas positive potential is not applied to the source.

Figure 8A:
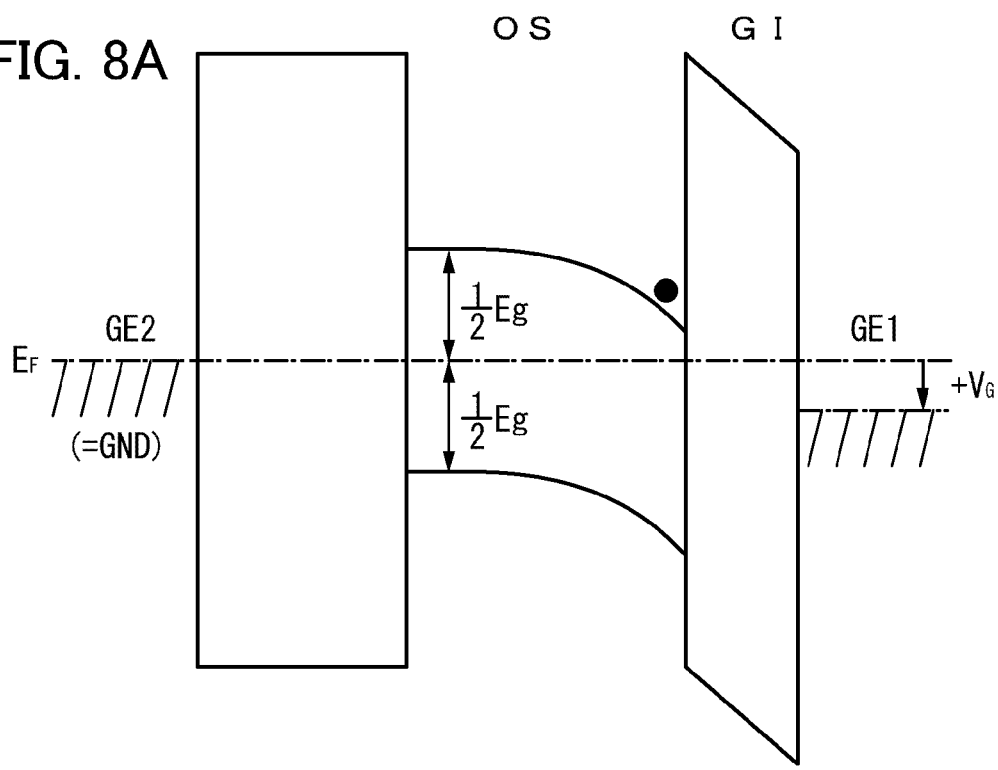
FIG. 8A shows a state where a positive potential ($V_G>0$) is applied to a gate (GE1)
Figure 8B:
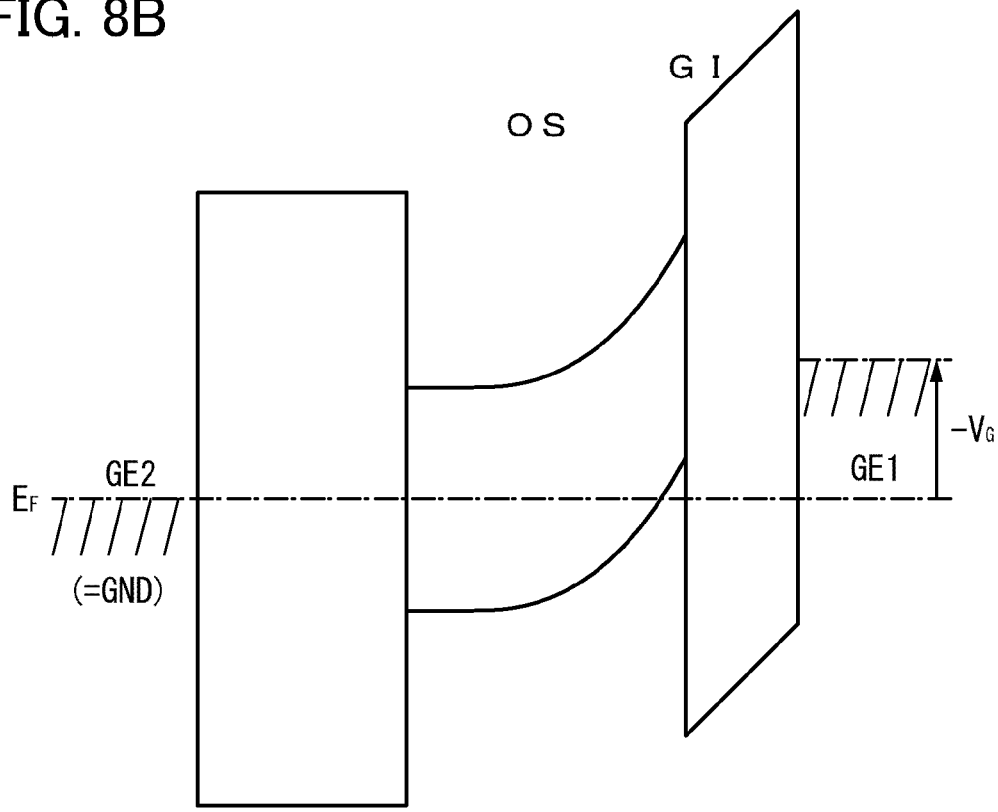
FIG. 8B shows a state where a negative potential ($-V_G<0$) is applied to the gate (GE1)

FIGS. 8A and 8B are energy band diagrams (schematic views) taken along the cross section B-B' of FIG. 6 in the case where a gate voltage is 0 V. FIG. 8A shows an on state in which a positive voltage ($V_G>0$) is applied to the gate (GE1) and carriers (electrons) flow between the source and the drain. FIG. 8B shows a state in which a negative voltage ($-V_G<0$) is applied to the gate (GE1), that is, a case where the transistor is in an off state (where minority carriers do not flow).

When the thickness of the oxide semiconductor is approximately 50 nm and a donor concentration becomes less than or equal to $1 \times 10^{18}/cm^3$ by highly purifying the oxide semiconductor, a depletion layer spreads throughout the oxide semiconductor. In other words, the transistor can be regarded as a fully-depletion type transistor.

Figure 9:
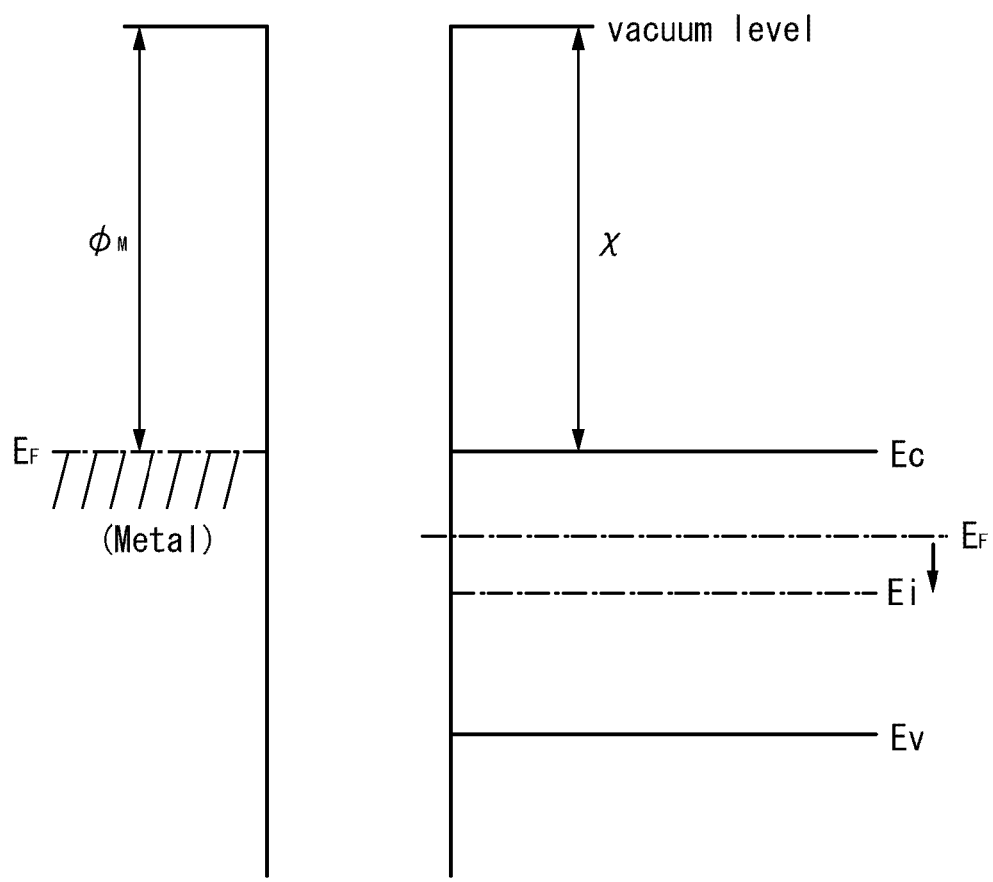
FIG. 9 shows relation between the vacuum level the work function of a metal ($\phi_M$) and relation between the vacuum level and the electron affinity of an oxide semiconductor ($\chi$)

FIG. 9 shows relation between the vacuum level and the work function of a metal ($\phi_M$) and relation between the vacuum level and the electron affinity ($\chi$) of an oxide semiconductor.

At normal temperature, electrons in the metal are degenerated and the Fermi level is located in the conduction band. On the other hand, a conventional oxide semiconductor is typically an n-type semiconductor, in which case the Fermi level ($E_F$) is away from the intrinsic Fermi level (Ei) located in the middle of a band gap and is located closer to the conduction band. Note that it is known that part of hydrogen is a donor in an oxide semiconductor and is one factor causing an oxide semiconductor to be an n-type semiconductor.

On the other hand, an oxide semiconductor of the present invention is an intrinsic (I-type) or a substantially intrinsic oxide semiconductor which is obtained by removing hydrogen that is an n-type impurity from an oxide semiconductor and purifying the oxide semiconductor so that an impurity that is not a main components of the oxide semiconductor is prevented from being contained therein as much as possible. In other words, a feature is that a purified i-type (intrinsic) semiconductor, or a semiconductor close thereto, is obtained not by adding an impurity but by removing an impurity such as hydrogen or water as much as possible. This enables the Fermi level ($E_F$) to be at the same level as the intrinsic Fermi level (Ei).

An oxide semiconductor has a band gap (Eg) of 3.05 eV to 3.15 eV. In the case where the band gap (Eg) of an oxide semiconductor is 3.15 eV, the electron affinity ($\chi$) is said to be 4.3 eV. The work function of titanium (Ti) used for forming the source and drain electrodes is substantially equal to the electron affinity ($\chi$) of the oxide semiconductor. In that case, a Schottky barrier for electrons is not formed at an interface between the metal and the oxide semiconductor.

In other words, in the case where the work function of the metal ($\phi M$) and the electron affinity ($\chi$) of the oxide semiconductor are equal to each other and the metal and the oxide semiconductor are in contact with each other, an energy band diagram (a schematic diagram) as illustrated in FIG. 7A is obtained.

In FIG. 7B, a black circle (●) represents an electron, and when a positive potential is applied to the drain, the electron is injected into the oxide semiconductor over the barrier (h) and flows toward the drain. In that case, the height of the barrier (h) changes depending on the gate voltage and the drain voltage; in the case where a positive drain voltage is applied, the height of the barrier (h) is smaller than the height of the barrier in FIG. 7A where no voltage is applied, that is, ½ of the band gap (Eg).

At this time, the electron moves in the bottom, which is energetically stable, on the oxide semiconductor side at the interface between the gate insulating film and the highly-purified oxide semiconductor as illustrated in FIG. 8A.

In addition, in FIG. 8B, when a negative potential (reverse bias) is applied to the gate electrode (GE1), the value of current is extremely close to zero because holes that are minority carriers are substantially zero.

By increasing the purity of the oxide semiconductor so that the oxide semiconductor does not include an impurity other than a main component thereof as much as possible, an intrinsic (i-type) or substantially intrinsic oxide semiconductor is obtained. Consequently, the interface characteristics with the gate insulating film become apparent. Therefore, the interface characteristics need to be considered separately from bulk characteristics. Thus, the gate insulating film is needed to form a favorable interface with the oxide semiconductor. For example, it is preferable to use an insulating film which is formed by a CVD method which uses high density plasma generated with a power frequency from the VHF band to a microwave band or an insulating film formed by a sputtering method.

The oxide semiconductor is highly purified and the interface between the oxide semiconductor and the gate insulating film is made favorable, whereby transistor characteristics of off current of less than or equal to $10^{-13}$ A and a subthreshold swing (S value) of 0.1 V/dec. (the thickness of the gate insulating film: 100 nm) are highly expected even when the element has a channel width W of $1 \times 10^4$ μm and a channel length of 3 μm.

As described above, the oxide semiconductor is highly purified so that the amount of impurities that are not main components of the oxide semiconductor are minimized, whereby a single crystal is formed and favorable operation of the transistor can be obtained.

[Embodiment 2]

Figure 10A:
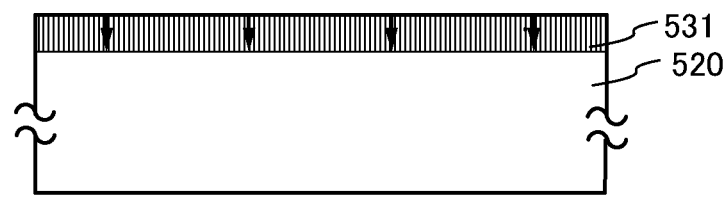
FIGS. 10A to 10C are cross-sectional process views of an embodiment of the present invention.

In this embodiment, the case where a first oxide component and a second oxide component are formed using oxide semiconductor materials including different components is described, although the case where the first oxide component and the second oxide component are formed using oxide semiconductor materials including the same components is described in Embodiment 1. Note that in FIG. 10A, the same portions as those in FIG. 1A are denoted by the same reference numerals.

In this embodiment, a first oxide semiconductor layer is formed to a thickness of 5 nm using a metal oxide target which does not include Ga and includes $In_2O_3$ and ZnO at 1:2 [molar ratio]. In the case of a bottom-gate transistor, because oxide of Ga is an insulator, higher field-effect mobility is obtained in the case where an In—Zn—O film is used as the first oxide semiconductor layer than in the case where an In—Ga—Zn—O film is used for the first oxide semiconductor layer.

Next, first heat treatment is performed. By the first heat treatment, a first oxide crystal component 531 which includes a single crystal is formed so as to extend to an interface between the first oxide semiconductor layer and the base component 520 by crystal growth from a surface of the first oxide semiconductor layer, although it depends on conditions such as materials of the first oxide semiconductor layer and a base component 520, heating temperature, and heating time (see FIG. 10A).

As the base component 520, an oxide layer, a metal layer, a nitride layer, and the like can be given. By the first heat treatment, crystal growth of the first oxide crystal component 531 which includes a single crystal whose crystal direction is relatively aligned proceeds from the surface of the first oxide semiconductor layer in the depth direction regardless of the material of the base component. The first oxide crystal component 531 is c-axis-aligned perpendicularly to the surface.

Figure 10B:
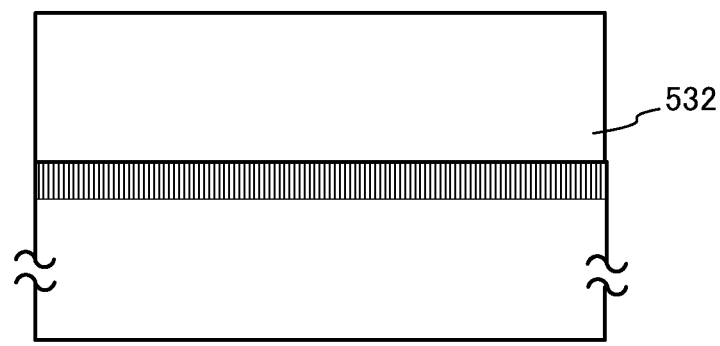

FIG. 10B is a cross-sectional view at the time just after a second oxide component 532 is deposited over the first oxide crystal component 531. In this embodiment, as the second oxide component 532, an In—Ga—Zn—O film with a thickness of 50 nm is formed using a target for an In—Ga—Zn—O-based oxide semiconductor including $In_2O_3$, $Ga_2O_3$, and ZnO at 1:1:2 [molar ratio].

Figure 10C:
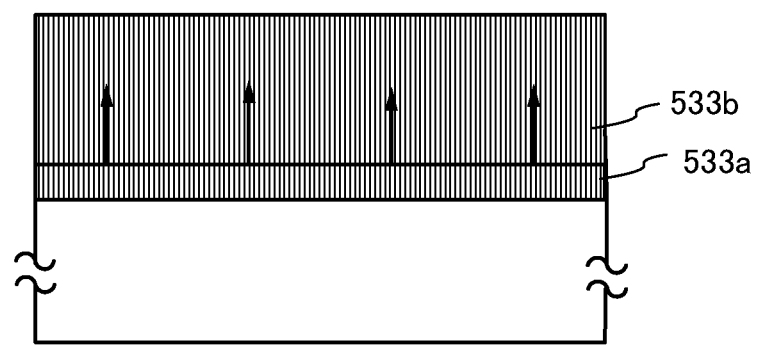

Then, after deposition of the second oxide component 532, second heat treatment is performed. By the second heat treatment, crystal growth is performed as illustrated in FIG. 10C. As illustrated in FIG. 10C, crystal growth proceeds upward toward a surface of the second oxide component using a crystal layer of the first oxide crystal component 531 as a seed, so that a second oxide crystal component 533b is formed.

The first oxide crystal component 531 obtained by the first heat treatment is heated again by the second heat treatment to be a third oxide crystal component 533a whose crystallinity is further increased.

As the second oxide component 532, an oxide semiconductor material whose component is different from that of the first oxide crystal component 531 is used. Therefore, as illustrated in FIG. 10C, a boundary between the third oxide crystal component 533a and the second oxide crystal component 533b is formed. In addition, also by the second heat treatment, almost the whole first oxide semiconductor layer including the vicinity of an interface with a gate insulating layer becomes a single crystal.

The structure of FIG. 10C can be referred to as a two-layer structure in which the first oxide crystal component 533a is stacked on and in contact with the base component 520 and the second oxide crystal component 533b is stacked thereover. By using the different materials, the field-effect mobility of the transistor can be increased. In addition, by using the In—Zn—O film which is crystallized easily than the In—Ga—Zn—O film as a seed of crystal growth, crystal growth is performed upward with high efficiency, so that the In—Ga—Zn—O film can become a single crystal In addition, the case where the materials of the second oxide crystal component in which crystal growth is performed and the first oxide crystal component serving as a base are the same is referred to as homoepitaxy. The case where the materials of the second oxide crystal component in which crystal growth is performed and the first oxide crystal component serving as a base are different is referred to as heteroepitaxy. This embodiment can employ any of homoepitaxy and heteroepitaxy by selecting respective materials.

The conditions of the first heat treatment and the conditions of the second heat treatment are within a range of the conditions described in Embodiment 1.

This embodiment can be freely combined with Embodiment 1.

[Embodiment 3]

In this embodiment, a transistor including a stacked oxide material including a c-axis-aligned crystal layer is manufactured, and by using the transistor for a pixel portion, and further a driver circuit, a semiconductor device having a display function (also referred to as a display device) is manufactured. Furthermore, when part or whole of a driver circuit using the transistors is formed over the same substrate as a pixel portion, a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC or the like including a controller is mounted on the panel. The display device relates to one mode of an element substrate before the display element is completed in a manufacturing process of the display device, and the element substrate is provided with a means for supplying a current to the display element in each of a plurality of pixels. Specifically, the element substrate may be in a state in which only a pixel electrode of the display element, a state in which a conductive layer to be a pixel electrode is formed but is not etched yet to form the pixel electrode, or any other states.

Note that a display device in this specification means an image display device, a display device, or a light source (including a lighting device). Further, the "display device" includes the following modules in its category: a module including a connector such as a flexible printed circuit (FPC), a tape automated bonding (TAB) tape, or a tape carrier package (TCP) attached; a module having a TAB tape or a TCP which is provided with a printed wiring board at the end thereof; and a module having an integrated circuit (IC) which is directly mounted on a display element by a chip on glass (COG) method.

In this embodiment, an example of a liquid crystal display device is described as a semiconductor device which is one embodiment of the present invention. The appearance and a cross section of a liquid crystal display panel, which is one embodiment of a semiconductor device, are described with reference to FIGS. 11A1, 11A2, and 11B. FIGS. 11A1 and 11A2 are each a top view of a panel in which transistors 4010 and 4011 which include a semiconductor layer of a stacked oxide material including a c-axis-aligned crystal layer, and a liquid crystal element 4013, which are formed over a first substrate 4001, are sealed between the first substrate 4001 and a second substrate 4006 with a sealant 4005. FIG. 11B corresponds to a cross-sectional view of FIGS. 11A1 and 11A2 along line M-N.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor or a polycrystalline semiconductor over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 11A1 illustrates an example of mounting the signal line driver circuit 4003 by a COG method, and FIG. 11A2 illustrates an example of mounting the signal line driver circuit 4003 by a TAB method.

Further, the pixel portion 4002 and the scan line driver circuit 4004 provided over the first substrate 4001 each include a plurality of transistors. FIG. 11B illustrates the transistor 4010 included in the pixel portion 4002 and the transistor 4011 included in the scan line driver circuit 4004. Insulating layers 4020 and 4021 are provided over the transistors 4010 and 4011.

For the transistors 4010 and 4011, a transistor including a stacked oxide material including a c-axis-aligned crystal layer in Embodiment 1 can be used. In this embodiment, the transistors 4010 and 4011 are n-channel transistors.

A conductive layer 4040 is provided over part of the insulating layer 4021 which overlaps with a channel formation region of an oxide semiconductor layer in the transistor 4011 for the driver circuit. The conductive layer 4040 is provided at the position overlapping with the channel formation region of the oxide semiconductor layer, whereby the amount of change in the threshold voltage of the transistor 4011 between before and after a BT test can be reduced. The conductive layer 4040 may have the same potential as or have potential different from that of a gate electrode layer of the transistor 4011 and can function as a second gate electrode layer. Alternatively, the potential of the conductive layer 4040 may be GND or 0 V, or the conductive layer 4040 may be in a floating state.

A pixel electrode layer 4030 included in the liquid crystal element 4013 is electrically connected to the transistor 4010. A counter electrode layer 4031 of the liquid crystal element 4013 is provided for the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 respectively which each function as an alignment film, and the liquid crystal layer 4008 is sandwiched between the pixel electrode layer 4030 and the counter electrode layer 4031 with the insulating layers 4032 and 4033 provided therebetween.

Note that the first substrate 4001 and the second substrate 4006 can be formed of glass, metal (typically, stainless steel), ceramic, or plastic. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

A columnar spacer 4035 which can be obtained in such a manner that an insulating layer is selectively etched is provided to control a distance (a cell gap) between the pixel electrode layer 4030 and the counter electrode layer 4031. Alternatively, a spherical spacer may also be used. The counter electrode layer 4031 is electrically connected to a common potential line provided over the same substrate as the transistor 4010. In addition, with the use of a common connection portion, the counter electrode layer 4031 and the common potential line can be electrically connected to each other by conductive particles arranged between the pair of substrates. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within an only narrow range of temperature, liquid crystal composition containing a chiral agent at 5 wt % or more so as to improve the temperature range is used for the liquid crystal layer 4008. The liquid crystal composition which includes a liquid crystal showing a blue phase and a chiral agent has a short response time of 1 msec or less, has optical isotropy, which makes the alignment process unneeded, and has a small viewing angle dependence.

When liquid crystal exhibiting a blue phase is used, rubbing treatment on an alignment film is unnecessary; accordingly, electrostatic discharge damage caused by the rubbing treatment can be prevented and defects and damage of the liquid crystal display device in the manufacturing process can be reduced. Thus, productivity of the liquid crystal display device can be increased. A transistor that uses an oxide semiconductor layer particularly has a possibility that electric characteristics of the transistor may fluctuate significantly by the influence of static electricity and deviate from the designed range. Therefore, it is more effective to use a liquid crystal material exhibiting a blue phase for the liquid crystal display device including a transistor which uses an oxide semiconductor layer.

Note that the liquid crystal display device described in this embodiment is an example of a transmissive liquid crystal display device; however, the liquid crystal display device can be applied to either a reflective liquid crystal display device or a semi-transmissive liquid crystal display device.

An example of the liquid crystal display device described in this embodiment is illustrated in which a polarizing plate is provided on the outer surface of the substrate (on the viewer side) and a coloring layer and an electrode layer used for a display element are provided on the inner surface of the substrate in that order; however, the polarizing plate may be provided on the inner surface of the substrate. The stacked structure of the polarizing plate and the coloring layer is not limited to this embodiment and may be set as appropriate depending on materials of the polarizing plate and the coloring layer or conditions of manufacturing process. A light-blocking layer which functions as a black matrix may be provided when needed.

In this embodiment, in order to reduce surface unevenness of the transistors and to improve reliability of the transistors, the transistors are covered with a protective layer or the insulating layers (the insulating layer 4020 and the insulating layer 4021) which function as planarization insulating layers. Note that the protective layer is provided to prevent entry of a contaminant impurity such as an organic substance, a metal substance, or moisture floating in air and is preferably a dense film. The protective layer may be formed with a single layer or a stacked layer of a silicon oxide layer, a silicon nitride layer, a silicon oxynitride layer, a silicon nitride oxide layer, an aluminum oxide layer, an aluminum nitride layer, aluminum oxynitride layer, and/or an aluminum nitride oxide layer by a sputtering method. In this embodiment, an example in which the protective layer is formed by a sputtering method is described; however, there is no particular limitation on a method, and various kinds of methods may be used.

Here, the insulating layer 4020 having a stacked structure is formed as the protective layer. Here, as a first layer of the insulating layer 4020, a silicon oxide layer is formed by a sputtering method. The use of a silicon oxide layer for the protective layer provides an advantageous effect of preventing hillock of an aluminum layer used for a source electrode layer and a drain electrode layer.

An insulating layer is formed as a second layer of the protective layer. Here, as a second layer of the insulating layer 4020, a silicon nitride layer is formed by a sputtering method. The use of the silicon nitride layer as the protective layer can prevent ions such as sodium ions from entering a semiconductor region, thereby suppressing variations in electric characteristics of the TFT.

The insulating layer 4021 is formed as the planarizing insulating layer. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating layers formed of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

There is no particular limitation on the method for forming the insulating layer 4021, and the insulating layer 4021 can be formed, depending on the material, by a sputtering method, an SOG method, spin coating, dipping, spray coating, a droplet discharge method (such as an inkjet method, screen printing, or offset printing), or with a tool such as a doctor knife, a roll coater, a curtain coater, or a knife coater. In a case of forming the insulating layer 4021 using a material solution, annealing (300° C. to 400° C.) of the semiconductor layer may be performed at the same time as a baking step. The baking step of the insulating layer 4021 also serves as annealing of the semiconductor layer, whereby a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

Conductive compositions including a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, the scan line driver circuit 4004, or the pixel portion 4002 from an FPC 4018.

In this embodiment, a connection terminal electrode 4015 is formed using the same conductive layer as the pixel electrode layer 4030 included in the liquid crystal element 4013. A terminal electrode 4016 is formed using the same conductive layer as the source and drain electrode layers included in the transistors 4010 and 4011.

The connection terminal electrode 4015 is electrically connected to a terminal included in the FPC 4018 through an anisotropic conductive layer 4019.

FIGS. 11A1, 11A2, and 11B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

In addition, if needed, a color filter is provided in each of the pixels. Furthermore, a polarizing plate or a diffusion plate is provided on the outer side of the first substrate 4001 and the second substrate 4006. Further, a light source of a backlight is formed using a cold-cathode tube or an LED. Thus, a liquid crystal display module is obtained.

The liquid crystal display module can employ a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (anti ferroelectric liquid crystal) mode, or the like.

Through the above process, a highly reliable liquid crystal display device can be manufactured.

By manufacturing a transistor in the driver circuit of the liquid crystal display device using the method for manufacturing a stacked oxide material including a c-axis-aligned crystal layer which is described in Embodiment 1, a normally off transistor can be provided in the driver circuit portion, so that power consumption can be reduced.

This embodiment can be implemented in appropriate combination with any of the structures described in the other embodiments.

[Embodiment 4]

The appearance and cross section of a light-emitting display panel (also referred to as a light-emitting panel) which is one mode of a semiconductor device will be described with reference to FIGS. 12A and 12B. FIG. 12A is a plan view of a panel in which a transistor which includes a stacked oxide material including a c-axis-aligned crystal layer and a light-emitting element formed over a first substrate are sealed between the first substrate and a second substrate with a sealant. FIG. 12B is a cross-sectional view taken along line H-I of FIG. 12A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal line driver circuits 4503a and 4503b, and the scan line driver circuits 4504a and 4504b formed over the first substrate 4501 each include a plurality of transistors, and a transistor 4510 included in the pixel portion 4502 and a transistor 4509 included in the signal line driver circuit 4503a are illustrated as an example in FIG. 12B.

For the transistors 4509 and 4510, the highly reliable transistor which includes a stacked oxide material including a c-axis-aligned crystal layer which is described in Embodiment 1 can be employed. In this embodiment, the transistors 4509 and 4510 are n-channel transistors.

Over an insulating layer 4544, a conductive layer 4540 is provided in a position overlapping with a channel formation region of an oxide semiconductor layer of the transistor 4509 used for a driver circuit. By providing the conductive layer 4540 so as to overlap with the channel formation region of the oxide semiconductor layer, the amount of change in the threshold voltage of the transistor 4509 between before and after the BT test can be reduced. Further, potential of the conductive layer 4540 may be the same as or different from that of a gate electrode layer of the transistor 4509. The conductive layer 4540 can function also as a second gate electrode layer. Alternatively, the potential of the conductive layer 4540 may be GND or 0 V, or the conductive layer 4540 may be in a floating state.

In the transistor 4509, as a protective insulating layer, an insulating layer 4541 is formed in contact with a semiconductor layer including a channel formation region. The oxide insulating layer 4541 can be formed using a material and a method which are similar to those of the oxide insulating layer 407 described in Embodiment 1. Moreover, the insulating layer 4544 functioning as a planarization insulating layer covers the transistor in order to reduce surface unevenness of the thin film transistor. Here, a silicon oxide layer is formed as the insulating layer 4541 by a sputtering method.

The insulating layer 4544 may be formed using a material and a method which are similar to those of the insulating layer 4021 described in Embodiment 3. Here, acrylic is used for the planarization insulating layer 4544.

Moreover, reference numeral 4511 denotes a light-emitting element. A first electrode layer 4517 which is a pixel electrode included in the light-emitting element 4511 is electrically connected to a source or drain electrode layer of the transistor 4510. Note that the structure of the light-emitting element 4511 is, but not limited to, the stack structure which includes the first electrode layer 4517, an electroluminescent layer 4512, and the second electrode layer 4513. The structure of the light-emitting element 4511 can be changed as appropriate depending on the direction in which light is extracted from the light-emitting element 4511, or the like.

A partition 4520 is made of an organic resin layer, an inorganic insulating layer, or organic polysiloxane. It is particularly preferable that the partition 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective layer may be formed over the second electrode layer 4513 and the partition 4520 in order to prevent oxygen, hydrogen, moisture, carbon dioxide, or the like from entering into the light-emitting element 4511. As the protection layer, a silicon nitride layer, a silicon nitride oxide layer, a DLC layer, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

A connection terminal electrode 4515 is formed using the same conductive layer as the first electrode layer 4517 included in the light-emitting element 4511, and a terminal electrode 4516 is formed using the same conductive layer as the source and drain electrode layers included in the transistors 4509 and 4510.

The connection terminal electrode 4515 is electrically connected to a terminal included in the FPC 4518a through an anisotropic conductive layer 4519.

As the second substrate located in the direction in which light is extracted from the light-emitting element 4511 needs to have a light-transmitting property. In that case, a light-transmitting material such as a glass plate, a plastic plate, a polyester film, or an acrylic film is used for the second substrate.

As the filler 4507, an ultraviolet curable resin or a thermosetting resin can be used, in addition to an inert gas such as nitrogen or argon. For example, PVC (polyvinyl chloride), an acrylic resin, polyimide, an epoxy resin, a silicone resin, PVB (polyvinyl butyral), or EVA (ethylene vinyl acetate) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Driver circuits formed using a single crystal semiconductor or a polycrystalline semiconductor over a substrate separately prepared may be mounted as the signal line driver circuits 4503a and 4503b and the scan line driver circuits 4504a and 4504b. In addition, only the signal line driver circuits or part thereof, or only the scan line driver circuits or part thereof may be separately formed and then mounted. This embodiment is not limited to the structure shown in FIGS. 12A and 12B.

Through the above steps, a highly reliable light-emitting display device (display panel) can be manufactured.

This embodiment can be implemented in appropriate combination with the structures described in the other embodiments.

[Embodiment 5]

An example of electronic paper will be described as a semiconductor device of an embodiment of the present invention.

A transistor including a stacked oxide material including a c-axis-aligned crystal layer obtained by the method described in Embodiment 1 may be used for electronic paper in which electronic ink is driven by an element electrically connected to a switching element. The electronic paper is also called an electrophoretic display device (electrophoretic display) and has advantages in that it has the same level of readability as regular paper, it has less power consumption than other display devices, and it can be set to have a thin and light form.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, if a plurality of the above microcapsules are arranged as appropriate over an active matrix substrate so as to be interposed between two electrodes, an active matrix display device can be completed, and display can be performed by application of an electric field to the microcapsules. For example, an active matrix substrate which is formed using a transistor including a stacked oxide material including a c-axis-aligned crystal layer of Embodiment 1 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

Figure 13:
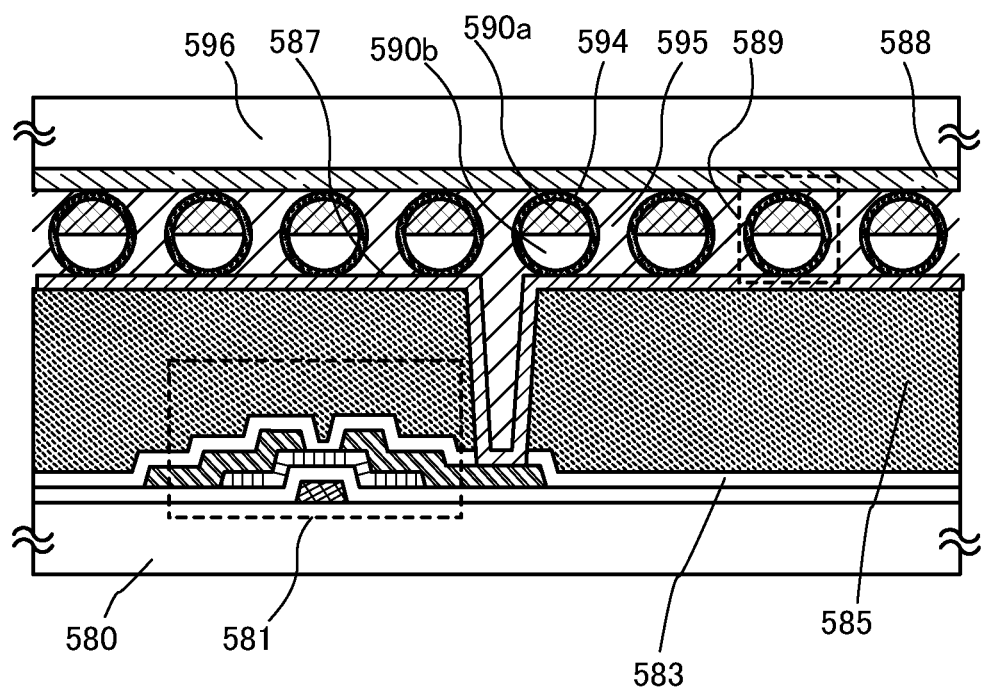
FIG. 13 is a cross-sectional view of an embodiment of the present invention.

FIG. 13 illustrates active matrix electronic paper as an example of a semiconductor device. A transistor 581 used for the semiconductor device can be manufactured in a manner similar to that of the transistor described in Embodiment 1 and is a highly reliable transistor which includes a stacked oxide material including a c-axis-aligned crystal layer.

The electronic paper in FIG. 13 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The transistor 581 is a bottom-gate film transistor and is covered with an insulating layer 583 that is in contact with the semiconductor layer. A source or drain electrode layer of the transistor 581 is in contact with a first electrode layer 587 through an opening formed in the insulating layers 583, an insulating layer 584, and an insulating layer 585, whereby the transistor 581 is electrically connected to the first electrode layer 587. Between a pair of electrodes 580 and 596, spherical particles 589 each having a black region 590a, a white region 590b, and a cavity 594 around the regions which is filled with liquid are provided between the first electrode layer 587 and a second electrode layer 588. A space around the spherical particles 589 is filled with a filler 595 such as a resin (see FIG. 13).

In addition, the first electrode layer 587 corresponds to a pixel electrode, and the second electrode layer 588 corresponds to a common electrode. The second electrode layer 588 is electrically connected to a common potential line provided over the same substrate as the transistor 581. With the use of a common connection portion, the second electrode layer 588 can be electrically connected to the common potential line through conductive particles provided between a pair of substrates.

Further, instead of the twisting ball, an electrophoretic element can also be used. A microcapsule having a diameter of about 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. The electrophoretic display element has higher reflectivity than a liquid crystal display element. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, highly reliable electronic paper can be manufactured.

This embodiment can be implemented in appropriate combination with the structures described in the other embodiments.

[Embodiment 6]

A semiconductor device disclosed in this specification can be applied to a variety of electronic appliances (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

In this embodiment, examples of an electronic appliance mounted with a display device which can be obtained in any of Embodiments 3 to 5 are described with reference to FIGS. 14A to 14E.

Figure 14A:
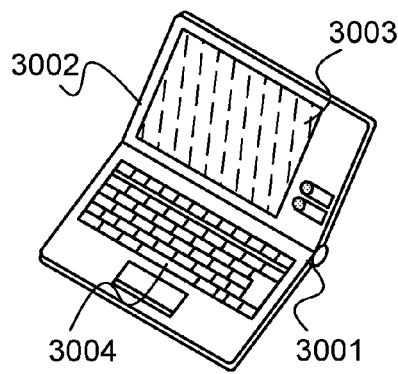
FIGS. 14A to 14E each illustrate an example of an electronic appliance.

FIG. 14A illustrates a laptop personal computer manufactured by mounting at least a display device as a component, which includes a main body 3001, a housing 3002, a display portion 3003, a keyboard 3004, and the like. Note that the laptop personal computer includes the liquid crystal display device described in Embodiment 3.

Figure 14D:
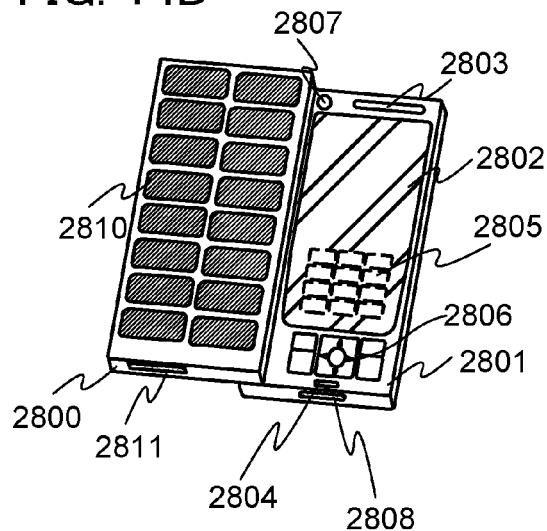
Figure 14B:
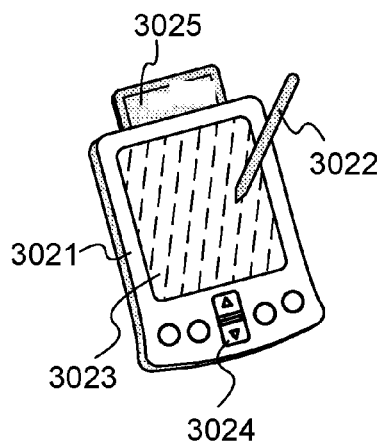

FIG. 14B is a portable information terminal (PDA) manufactured by mounting at least a display device as a component, which includes a display portion 3023, an external interface 3025, an operation button 3024, and the like in a main body 3021. A stylus 3022 is included as an accessory for operation. Note that the portable information terminal includes the light-emitting display device described in Embodiment 4.

Figure 14E:
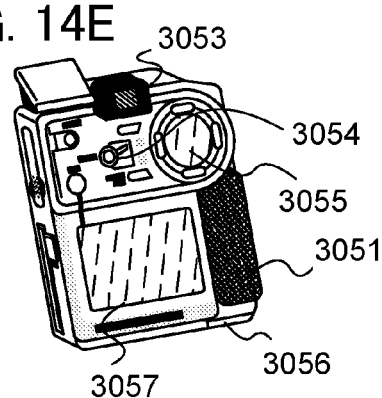
Figure 14C:
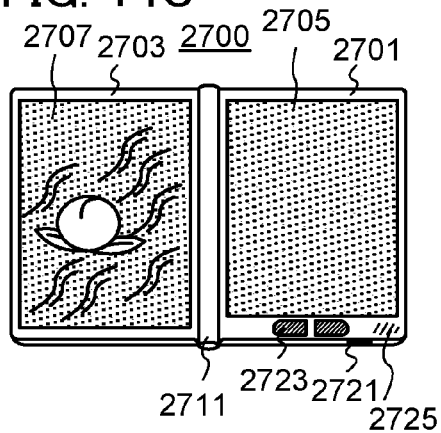

FIG. 14C illustrates an e-book reader mounted with the electronic paper described in Embodiment 5 as a component. FIG. 14C shows an example of an e-book reader. For example, an e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the structure where different images are displayed on different display portions, for example, the right display portion (the display portion 2705 in FIG. 14C) displays text and the left display portion (the display portion 2707 in FIG. 14C) displays images.

FIG. 14C illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

FIG. 14D is a mobile phone manufactured by mounting at least a display device as a component, which includes two housings, a housing 2800 and a housing 2801. The housing 2801 includes a display panel 2802, a speaker 2803, a microphone 2804, a pointing device 2806, a camera lens 2807, an external connection terminal 2808, and the like. The housing 2800 is provided with a solar cell 2810 for charging the portable information terminal, an external memory slot 2811, and the like. Further, an antenna is incorporated in the housing 2801.

The display panel 2802 is provided with a touch panel. A plurality of operation keys 2805 which is displayed as images is illustrated by dashed lines in FIG. 14D. Note that the display panel 2802 is also mounted with a booster circuit for raising a voltage output from the solar battery cell 2810 to a voltage needed for each circuit.

In the display panel 2802, the display direction can be appropriately changed depending on a usage pattern. Further, the display device is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housings 2800 and 2801 in a state where they are developed as illustrated in FIG. 14D can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided.

FIG. 14E is a digital camera manufactured by mounting at least a display device as a component, which includes a main body 3051, a display portion (A) 3057, an eyepiece 3053, operation switches 3054, a display portion (B) 3055, a battery 3056, and the like.

This embodiment can be freely combined with any one of Embodiments 1 to 5.

EXAMPLE 1

In this example, a transistor in which a stack of oxide crystal components was used as a semiconductor layer was manufactured and a cross section thereof was observed.

Samples were formed as follows. A silicon oxynitride film (a base film) with a thickness of 30 nm was formed over a glass substrate by a PCVD method. Then, a gate electrode layer and a gate insulating layer were formed, an In—Ga—Zn—O film was formed thereover to a thickness of 3 nm, and first heat treatment (in a nitrogen atmosphere at 650° C. for 6 minutes) was performed. After that, an In—Ga—Zn—O film was formed to a thickness of 30 nm and second heat treatment was performed. Then, the In—Ga—Zn—O film was patterned using a photolithography technique. Then, the conductive films of a titanium film (the thickness of 100 nm), an aluminum film (the thickness of 200 nm), and a titanium film (the thickness of 100 nm) were formed and then patterned using a photolithography technique, so that a source electrode layer and a drain electrode layer were formed. After that, a silicon oxide film (the thickness of 300 nm) was formed using a sputtering method so as to cover the source electrode layer and the drain electrode layer. Sequentially, an acrylic resin was formed. The resulting transistor is a channel-etched transistor.

When the In—Ga—Zn—O film was deposited, the following deposition conditions were used: a metal oxide target including $In_2O_3$, $Ga_2O_3$, and ZnO at 1:1:2 [molar ratio] was used; the pressure was 0.6 Pa; the direct current (DC) power source was 5 kW; an mixed atmosphere of oxygen and argon (an oxygen flow rate of 50 sccm and an argon flow rate of 50 sccm) was used; the substrate temperature was 200° C.; and the deposition rate was 13.4 nm/min.

By observation of the cross section of Sample 1 formed through the second heat treatment in a nitrogen atmosphere at 650° C. for 6 minutes, it was found that almost all of the part from an interface between the lower In—Ga—Zn—O film and the gate insulating layer to the surface of the upper In—Ga—Zn—O film was crystallized. In addition, it was confirmed that crystallization was performed along an alignment on the side of the interface between the In—Ga—Zn—O film and the gate insulating layer. In addition, crystallization was performed from an interface between a channel formation region and the silicon oxide film (the thickness of 300 nm) and an alignment was observed. Note that the total thickness of the In—Ga—Zn—O films overlapping with the drain electrode layer was 25 nm. The thickness of the channel formation region was 22.5 nm.

By observation of a cross section of Sample 2 formed through the second heat treatment in a mixed atmosphere of nitrogen and oxygen at 450° C. for 15 hours, it was found that although crystallization was performed from the interface between the In—Ga—Zn—O film and the gate insulating layer, part of the In—Ga—Zn—O was amorphous.

In this manner, since a region which is crystallized varies depending on heat treatment conditions after deposition of the oxide semiconductor films, it is preferable that practitioners adjust conditions for manufacturing a device as appropriate.

This application is based on Japanese Patent Application serial no. 2009-270855 filed with Japan Patent Office on Nov. 28, 2009, the entire contents of which are hereby incorporated by reference.

Explanation of Reference

400: substrate; 401: gate electrode layer; 402: gate insulting layer; 403: first oxide semiconductor layer; 404: second oxide semiconductor layer; 405a: source electrode layer; 405b: drain electrode layer; 407: oxide insulating layer; 430: oxide semiconductor stack; 431: oxide semiconductor stack; 432: oxide semiconductor stack; 470: transistor; 500: base component; 501: first oxide crystal component; 502: second oxide component; 503a: crystal region; 520: base component; 531: first oxide crystal component; 532: second oxide component; 533a: oxide crystal component; 533b: oxide crystal component; 580: substrate; 581: transistor; 583: insulating layer; 587: electrode layer; 588: electrode layer; 589: spherical particle; 590a: black region; 590b: white region; 594: cavity; 595: filler; 2700: e-book reader; 2701: housing; 2703: housing; 2705: display portion; 2707: display portion; 2711: hinge; 2721: power switch; 2723: operation key; 2725: speaker; 2800: housing; 2801: housing; 2802: display panel; 2803: speaker; 2804: microphone; 2805: operation key; 2806: pointing device; 2807: camera lens: external connection terminal; 2810: solar battery; 2811: external memory slot; 3001: main body; 3002: housing; 3003: display portion; 3004: keyboard; 3021: main body; 3022: stylus; 3023: display portion; 3024: operation button; 3025: external interface; 3051: main body; 3053: eyepiece; 3054: operation switch; 3055: display portion(B); 3056: battery; 3057: display portion (A); 4001: substrate; 4002: pixel portion; 4003: signal line driver circuit; 4004: scan line driver circuit; 4005: sealant; 4006: second substrate; 4008: liquid crystal layer; 4010: transistor; 4011: transistor; 4013: liquid crystal element; 4015: connection terminal electrode; 4016: terminal electrode; 4018: FPC; 4019: anisotropic conductive layer; 4020: insulating layer; 4021: insulting layer; 4030: pixel electrode layer; 4031: counter electrode layer; 4032: insulting layer; 4040: conductive layer; 4501: first substrate; 4502: pixel portion; 4503a: signal line driver circuit; 4503b: signal line driver circuit; 4504a: scan line driver circuit; 4504b: scan line driver circuit; 4505: sealant; 4506: second substrate; 4507: filler; 4509: transistor; 4510: transistor; 4511: light-emitting element; 4512: electroluminescent layer; 4513: electrode layer; 4515: connection terminal electrode; 4516: terminal electrode; 4517: electrode layer; 4518a: FPC; 4518b: FPC; 4519: anisotropic conductive layer; 4520: partition; 4540: conductive layer; 4541: insulating layer; 4543: protective insulating layer; 4544: insulating layer;

The invention claimed is:

1. A method for manufacturing a semiconductor device, comprising the steps of:
    forming a gate electrode layer including a flat surface over a surface of a base;
    forming a gate insulating layer over the gate electrode layer;
    forming a first oxide semiconductor layer over the gate insulating layer;
    causing crystal growth which proceeds from a surface toward an inside of the first oxide semiconductor layer by first heat treatment to form a first single crystal layer;
    forming a second oxide semiconductor layer over the first single crystal layer;
    causing crystal growth which proceeds from the first single crystal layer toward a surface of the second oxide semiconductor layer thereover by second heat treatment to form a second single crystal layer; and
    forming a source electrode layer and a drain electrode layer over a stack of the first single crystal layer and the second single crystal layer.

2. The method for manufacturing a semiconductor device, according to claim 1,
    wherein the source electrode layer or the drain electrode layer overlaps with an edge portion and a portion of the flat surface of the gate electrode layer.

3. The method for manufacturing a semiconductor device, according to claim 1, wherein the first single crystal layer has an a-b plane along a surface thereof and is c-axis-aligned perpendicularly to the surface thereof.

4. The method for manufacturing a semiconductor device, according to claim 1, wherein the second single crystal layer has an a-b plane in a surface thereof and is c-axis-aligned perpendicularly to the surface thereof.

5. The method for manufacturing a semiconductor device, according to claim 1, wherein the second oxide semiconductor layer has a larger thickness than the first oxide semiconductor layer.

6. The method for manufacturing a semiconductor device, according to claim 1, wherein the first oxide semiconductor layer and the second oxide semiconductor layer have a same electron affinity.

7. The method for manufacturing a semiconductor device, according to claim 1, wherein the first oxide semiconductor layer and the second oxide semiconductor layer are formed using different materials.

8. A semiconductor device comprising:
   a gate electrode layer including a flat surface over a surface of a base;
   a gate insulating layer over the gate electrode layer;
   a first single crystal layer which is over and at least partly in contact with the gate insulating layer, has an a-b plane along a surface thereof and c-axis-aligned perpendicularly to the surface thereof;
   a second single crystal layer which is over and in contact with the first single crystal layer, has an a-b plane along a surface thereof and is c-axis-aligned perpendicularly to the surface thereof; and
   a source electrode layer and a drain electrode layer over a stack of the first single crystal layer and the second single crystal layer,
   wherein the first single crystal layer and the second single crystal layer are metal oxide layers.

9. The semiconductor device according to claim 8, wherein the second single crystal layer has a larger thickness than the first single crystal layer.

10. The semiconductor device according to claim 8, wherein the first single crystal layer and the second single crystal layer have a same electron affinity.

11. The semiconductor device according to claim 8, wherein the first single crystal layer and the second single crystal layer are formed using different materials.

12. The semiconductor device according to claim 8, wherein a difference in height at a region in the surface of the second single crystal layer which overlaps with the gate electrode layer is less than or equal to 1 nm.

13. The semiconductor device according to claim 8, wherein a difference in height at a region in the surface of the second single crystal layer which overlaps with the gate electrode layer is less than or equal to 0.2 nm.

14. The semiconductor device according to claim 8, wherein the first single crystal layer and the second single crystal layer are one single crystal.

15. A semiconductor device comprising:
   a gate electrode layer including a flat surface over a surface of a base;
   a gate insulating layer over the gate electrode layer;
   a first single crystal layer which is over and at least partly in contact with the gate insulating layer, has an a-b plane along a surface thereof and is c-axis-aligned perpendicularly to the surface thereof;
   a second single crystal layer which is on and in contact with the first single crystal layer, has an a-b plane along a surface thereof and is c-axis-aligned perpendicularly to the surface thereof; and
   a source electrode layer and a drain electrode layer over a stack of the first single crystal layer and the second single crystal layer,
   wherein the source electrode layer or the drain electrode layer is provided so as to overlap with a portion of the flat surface of the gate electrode layer.

16. The semiconductor device according to claim 15, wherein the second single crystal layer has a larger thickness than the first single crystal layer.

17. The semiconductor device according to claim 15, wherein the first single crystal layer and the second single crystal layer have a same electron affinity.

18. The semiconductor device according to claim 15, wherein the first single crystal layer and the second single crystal layer are formed using different materials.

19. The semiconductor device according to claim 15, wherein a difference in height at a region in the surface of the second single crystal layer which overlaps with the gate electrode layer is less than or equal to 1 nm.

20. The semiconductor device according to claim 15, wherein a difference in height at a region in the surface of the second single crystal layer which overlaps with the gate electrode layer is less than or equal to 0.2 nm.

21. The semiconductor device according to claim 15, wherein the first single crystal layer and the second single crystal layer are one single crystal.

22. A method for manufacturing a semiconductor device, comprising the steps of:
   forming a first oxide semiconductor layer over a substrate;
   causing crystal growth which proceeds from a surface toward an inside of the first oxide semiconductor layer by heat treatment, wherein a crystal layer is formed at the surface of the first oxide semiconductor layer; and
   forming a second oxide semiconductor layer over the first oxide semiconductor layer,
   wherein the first oxide semiconductor layer and the second oxide semiconductor layer each comprise indium, zinc and a metal other than indium and zinc.

23. The method for manufacturing a semiconductor device according to claim 22, wherein the crystal layer has an a-b plane along a surface thereof and is c-axis-aligned perpendicularly to the surface thereof.

24. The method for manufacturing a semiconductor device according to claim 22, wherein the second oxide semiconductor layer has an a-b plane along a surface thereof and is c-axis-aligned perpendicularly to the surface thereof.

25. The method for manufacturing a semiconductor device according to claim 22, wherein the metal other than indium and zinc includes gallium.

26. The method for manufacturing a semiconductor device according to claim 22, wherein the first oxide semiconductor layer has a thickness of greater than or equal to 2 nm and less than or equal to 15 nm.

27. The method for manufacturing a semiconductor device according to claim 22, wherein the heat treatment is performed in a nitrogen atmosphere, an oxygen atmosphere, or a dry air atmosphere at a temperature higher than or equal to 450° C. and lower than or equal to 850° C.

28. The method for manufacturing a semiconductor device according to claim 22, wherein the crystal layer is a single crystal layer.

29. The method for manufacturing a semiconductor device according to claim 22, wherein a hydrogen concentration of each of the first oxide semiconductor layer and the second oxide semiconductor layer is less than $1\times10^{18}$ cm$^{-3}$.

30. The method for manufacturing a semiconductor device according to claim 22, wherein a carrier concentration of each of the first oxide semiconductor layer and the second oxide semiconductor layer is less than $1\times10^{12}$ cm$^{-3}$.

31. The method for manufacturing a semiconductor device according to claim 22, wherein each of the first oxide semiconductor layer and the second oxide semiconductor layer has high purity and has an intrinsic conductivity type.

32. The method for manufacturing a semiconductor device according to claim 22, wherein the first oxide semiconductor layer and the second oxide semiconductor layer are formed using different materials.

33. A method for manufacturing a semiconductor device, comprising the steps of:
forming a first oxide semiconductor layer over a substrate;
causing crystal growth which proceeds from a surface toward an inside of the first oxide semiconductor layer by first heat treatment, wherein a crystal layer is formed at the surface of the first oxide semiconductor layer; and
forming a second oxide semiconductor layer over the first oxide semiconductor layer;
causing crystal growth of the second oxide semiconductor layer by second heat treatment using the crystal layer as a seed;
wherein the first oxide semiconductor layer and the second oxide semiconductor layer each comprise indium, zinc and a metal other than indium and zinc.

34. The method for manufacturing a semiconductor device according to claim 33, wherein the crystal layer has an a-b plane along a surface thereof and is c-axis-aligned perpendicularly to the surface thereof.

35. The method for manufacturing a semiconductor device according to claim 33, wherein the second oxide semiconductor layer has an a-b plane along a surface thereof and is c-axis-aligned perpendicularly to the surface thereof.

36. The method for manufacturing a semiconductor device according to claim 33, wherein the metal other than indium and zinc includes gallium.

37. The method for manufacturing a semiconductor device according to claim 33, wherein the first oxide semiconductor layer has a thickness of greater than or equal to 2 nm and less than or equal to 15 nm.

38. The method for manufacturing a semiconductor device according to claim 33, wherein the first heat treatment and the second heat treatment are each performed in a nitrogen atmosphere, an oxygen atmosphere, or a dry air atmosphere at a temperature higher than or equal to 450° C. and lower than or equal to 850° C.

39. The method for manufacturing a semiconductor device according to claim 33, wherein the crystal growth of the second oxide semiconductor layer proceeds from the surface of the first oxide semiconductor layer toward a surface of the second oxide semiconductor layer.

40. The method for manufacturing a semiconductor device according to claim 33, wherein the crystal layer is a single crystal layer.

41. The method for manufacturing a semiconductor device according to claim 33, wherein a hydrogen concentration of each of the first oxide semiconductor layer and the second oxide semiconductor layer is less than $1\times10^{18}$ cm$^{-3}$.

42. The method for manufacturing a semiconductor device according to claim 33, wherein a carrier concentration of each of the first oxide semiconductor layer and the second oxide semiconductor layer is less than $1\times10^{12}$ cm$^{-3}$.

43. The method for manufacturing a semiconductor device according to claim 33, wherein each of the first oxide semiconductor layer and the second oxide semiconductor layer has high purity and has an intrinsic conductivity type.

44. The method for manufacturing a semiconductor device according to claim 33, wherein the first oxide semiconductor layer and the second oxide semiconductor layer are formed using different materials.

45. A method for manufacturing a semiconductor device, comprising the steps of:
forming a first oxide semiconductor layer over a substrate by a sputtering method;
performing first heat treatment to the first oxide semiconductor layer;
forming a second oxide semiconductor layer over the first oxide semiconductor layer by a sputtering method, wherein the substrate is heated during deposition of the second oxide semiconductor layer;
performing second heat treatment to the second oxide semiconductor layer;
wherein the first oxide semiconductor layer and the second oxide semiconductor layer each comprise indium, zinc and a metal other than indium and zinc.

46. The method for manufacturing a semiconductor device according to claim 45, wherein a crystal growth of the first oxide semiconductor layer is caused by the first heat treatment.

47. The method for manufacturing a semiconductor device according to claim 45, wherein a crystal growth of the second oxide semiconductor layer is caused by the second heat treatment.

48. The method for manufacturing a semiconductor device according to claim 45, wherein the metal other than indium and zinc includes gallium.

49. The method for manufacturing a semiconductor device according to claim 45, wherein the first oxide semiconductor layer has a thickness of greater than or equal to 2 nm and less than or equal to 15 nm.

50. The method for manufacturing a semiconductor device according to claim 45, wherein the first heat treatment and the second heat treatment are each performed in a nitrogen atmosphere, an oxygen atmosphere, or a dry air atmosphere at a temperature higher than or equal to 450° C. and lower than or equal to 850° C.

51. The method for manufacturing a semiconductor device according to claim 45, wherein the heating of the substrate during the deposition of the second oxide semiconductor layer is performed at a temperature higher than or equal to 200° C. and lower than or equal to 600° C.

52. The method for manufacturing a semiconductor device according to claim 45, wherein a hydrogen concentration of each of the first oxide semiconductor layer and the second oxide semiconductor layer is less than $1\times10^{18}$ cm$^{-3}$.

53. The method for manufacturing a semiconductor device according to claim 45, wherein a carrier concentration of each of the first oxide semiconductor layer and the second oxide semiconductor layer is less than $1\times10^{12}$ cm$^{-3}$.

54. The method for manufacturing a semiconductor device according to claim 45, wherein each of the first oxide semiconductor layer and the second oxide semiconductor layer has high purity and has an intrinsic conductivity type.

55. The method for manufacturing a semiconductor device according to claim 45, wherein the first oxide semiconductor layer and the second oxide semiconductor layer are formed using different materials.

56. A method for manufacturing a semiconductor device, comprising the steps of:

forming a gate electrode layer over a substrate;
forming an insulating layer over the gate electrode layer;
forming a first oxide semiconductor layer over the insulating layer;
performing first heat treatment to the first oxide semiconductor layer;
forming a second oxide semiconductor layer over the first oxide semiconductor layer, wherein the substrate is heated during deposition of the second oxide semiconductor layer; and
performing second heat treatment to the second oxide semiconductor layer,
wherein the first oxide semiconductor layer and the second oxide semiconductor layer each comprise a region overlapping with the gate electrode layer, and
wherein the first oxide semiconductor layer and the second oxide semiconductor layer each comprise indium, zinc and a metal other than indium and zinc.

57. The method for manufacturing a semiconductor device according to claim 56, further comprising a step of forming a source electrode and a drain electrode which are electrically connected to the first oxide semiconductor layer and the second oxide semiconductor layer.

58. The method for manufacturing a semiconductor device according to claim 56, wherein the heating of the substrate during the deposition of the second oxide semiconductor layer is performed at a temperature higher than or equal to 200° C. and lower than or equal to 600° C.

59. The method for manufacturing a semiconductor device according to claim 56, wherein a hydrogen concentration of each of the first oxide semiconductor layer and the second oxide semiconductor layer is less than $1 \times 10^{18}$ cm$^{-3}$.

60. A method for manufacturing a semiconductor device, comprising the steps of:
forming a first gate electrode layer over a substrate;
forming a first insulating layer over the first gate electrode layer;
forming a first oxide semiconductor layer over the first insulating layer;
performing first heat treatment;
forming a second oxide semiconductor layer over the first oxide semiconductor layer, wherein the substrate is heated during deposition of the second oxide semiconductor layer;
performing second heat treatment;
forming a second insulating layer over the second oxide semiconductor layer; and
forming a second gate electrode layer over the second insulating layer,
wherein the first oxide semiconductor layer and the second oxide semiconductor layer each comprise a region overlapping with the first gate electrode layer,
wherein the first oxide semiconductor layer and the second oxide semiconductor layer each comprise a region overlapping with the second gate electrode layer, and
wherein the first oxide semiconductor layer and the second oxide semiconductor layer each comprise indium, zinc and a metal other than indium and zinc.

61. The method for manufacturing a semiconductor device according to claim 60, further comprising a step of forming a source electrode and a drain electrode which are electrically connected to the first oxide semiconductor layer and the second oxide semiconductor layer.

62. The method for manufacturing a semiconductor device according to claim 60, wherein the heating of the substrate during the deposition of the second oxide semiconductor layer is performed at a temperature higher than or equal to 200° C. and lower than or equal to 600° C.

63. The method for manufacturing a semiconductor device according to claim 60, wherein a hydrogen concentration of each of the first oxide semiconductor layer and the second oxide semiconductor layer is less than $1 \times 10^{18}$ cm$^{-3}$.

* * * * *